(12) United States Patent
Ebeling

(10) Patent No.: US 10,687,432 B2
(45) Date of Patent: *Jun. 16, 2020

(54) RECEPTACLE COVER

(71) Applicant: Cordell Eldred Ebeling, Isanti, MN (US)

(72) Inventor: Cordell Eldred Ebeling, Isanti, MN (US)

(*) Notice: Subject to any disclaimer, the term of this patent is extended or adjusted under 35 U.S.C. 154(b) by 0 days.

This patent is subject to a terminal disclaimer.

(21) Appl. No.: 16/193,645

(22) Filed: Nov. 16, 2018

(65) Prior Publication Data

US 2019/0090372 A1 Mar. 21, 2019

Related U.S. Application Data

(63) Continuation of application No. 15/275,641, filed on Sep. 26, 2016, now Pat. No. 10,136,534, which is a
(Continued)

(51) Int. Cl.
*F21V 33/00* (2006.01)
*H05K 5/03* (2006.01)
(Continued)

(52) U.S. Cl.
CPC ............. *H05K 5/03* (2013.01); *F21V 21/00* (2013.01); *H01R 13/5213* (2013.01); *H01R 13/6641* (2013.01); *H01R 13/6683* (2013.01); *H01R 13/717* (2013.01); *H01R 25/006* (2013.01); *H02G 3/14* (2013.01); *H05B 47/10* (2020.01); *H01R 2103/00* (2013.01)

(58) Field of Classification Search
CPC . F21V 21/00; H01R 13/5213; H01R 13/6641; H01R 13/6683; H01R 25/006; H02G 3/14; H05B 37/02; H05K 5/03
USPC .......................................................... 362/95
See application file for complete search history.

(56) References Cited

U.S. PATENT DOCUMENTS 2,015,698 A  10/1935 Tiffany
D141,030 S   4/1945 Wheeler, Jr.
(Continued)

FOREIGN PATENT DOCUMENTS

EP    1628373 A1   2/2006
WO    2008123964 A1  10/2008
(Continued)

OTHER PUBLICATIONS

Louvered Recessed Night Light with 10 Watts. Datasheet [online]. American Lighting LLC. Retrieved May 17, 2012 from <http://www.csnstores.com/American-Lighting-LLC-RNLS-1-ali1923.html?cv> (5 pages).
(Continued)

*Primary Examiner* — Ali Alavi

(57) ABSTRACT

A cover for an electrical receptacle including a faceplate. The cover also includes a first transmission tab configured to be electrically connected to a first power line of the electrical receptacle and a second transmission tab configured to be electrically connected to a second power line of the electrical receptacle. Additionally, the cover includes a device (such as a light source, circuit, port, or sensor) in communication with the first transmission tab and the second transmission tab.

20 Claims, 31 Drawing Sheets

Related U.S. Application Data continuation of application No. 14/158,322, filed on Jan. 17, 2014, now Pat. No. 9,464,795, which is a continuation of application No. 13/233,252, filed on Sep. 15, 2011, now Pat. No. 8,668,347.

(60) Provisional application No. 61/383,457, filed on Sep. 16, 2010.

(51) Int. Cl.
| | |
|---|---|
| *H01R 13/52* | (2006.01) |
| *H01R 13/66* | (2006.01) |
| *H01R 25/00* | (2006.01) |
| *H02G 3/14* | (2006.01) |
| *H05B 47/10* | (2020.01) |
| *F21V 21/00* | (2006.01) |
| *H01R 13/717* | (2006.01) |
| *H01R 103/00* | (2006.01) |

(56) References Cited

U.S. PATENT DOCUMENTS

| | | |
|---|---|---|
| 2,428,167 A | 9/1947 | Linton |
| 2,575,820 A | 11/1951 | Linton |
| 2,934,590 A | 4/1960 | Thompson et al. |
| 3,522,595 A | 8/1970 | White |
| 3,680,237 A | 8/1972 | Finnerty, Sr. |
| 3,859,454 A | 1/1975 | Mann |
| 4,282,591 A | 8/1981 | Andreuccetti |
| 4,534,486 A | 8/1985 | Eidson |
| 5,485,356 A | 1/1996 | Nguyen |
| 5,816,682 A | 10/1998 | Marischen |
| 6,087,588 A | 7/2000 | Soules |
| 6,423,900 B1 | 7/2002 | Soules |
| 6,765,149 B1 | 7/2004 | Ku |
| 7,011,422 B2 | 3/2006 | Robertson et al. |
| 7,321,348 B2 | 1/2008 | Cok et al. |
| 7,360,912 B1 | 4/2008 | Savicki, Jr. |
| 7,480,123 B2 | 1/2009 | Jones |
| 7,506,990 B2 | 3/2009 | Glazner |
| 7,511,231 B2 | 3/2009 | Drane et al. |
| 7,547,131 B2 | 6/2009 | Faunce |
| 7,549,785 B2 | 6/2009 | Faunce |
| 7,674,976 B2 | 3/2010 | Eastin |
| 7,850,322 B2 | 12/2010 | Glazner et al. |
| 8,003,886 B1 | 8/2011 | Rintz |
| 8,075,149 B2 | 12/2011 | Ko et al. |
| 8,158,885 B2 | 4/2012 | Eastin |
| 8,175,533 B2 | 5/2012 | Schubert |
| 8,467,734 B2 | 6/2013 | Schubert |
| 8,558,710 B1 | 10/2013 | Nitz |
| 8,564,279 B2 | 10/2013 | Johnson et al. |
| 8,629,617 B2 | 1/2014 | Richards et al. |
| 8,638,085 B2 | 1/2014 | Hilton et al. |
| 8,668,347 B2 * | 3/2014 | Ebeling .............. H01R 13/5213 362/95 |
| 8,770,424 B1 | 7/2014 | Shaw et al. |
| 8,797,723 B2 | 8/2014 | Hilton et al. |
| 8,912,442 B2 * | 12/2014 | Smith ...................... H02G 3/14 |
| 9,464,795 B2 | 10/2016 | Ebeling |
| 9,525,232 B1 * | 12/2016 | Insalaco .............. H01R 13/447 |
| 9,755,374 B2 | 9/2017 | St Laurent et al. |
| 9,882,361 B2 | 1/2018 | Smith et al. |
| 9,899,814 B2 * | 2/2018 | Smith ...................... H02G 3/14 |
| 9,917,430 B2 * | 3/2018 | Smith ...................... H02G 3/14 |
| 10,109,945 B2 * | 10/2018 | Smith .................. H01R 13/447 |
| 10,136,534 B2 | 11/2018 | Ebeling |
| 2001/0046130 A1 | 11/2001 | Cunningham et al. |
| 2002/0131262 A1 | 9/2002 | Amburgey |
| 2013/0043978 A1 | 2/2013 | Brooks |
| 2013/0240470 A1 | 9/2013 | Huang |

FOREIGN PATENT DOCUMENTS

| | | |
|---|---|---|
| WO | 2010011862 A1 | 1/2010 |
| WO | 2013019394 A1 | 2/2013 |
| WO | 2014070846 A1 | 5/2014 |

OTHER PUBLICATIONS

Louvered Recessed Night Light with 2 x .25 Watt LED. Datasheet [online]. American Lighting LLC. Retrieved May 17, 2012 from <http://www.csnstores.com/American-Lighting-LLC-RNLS-3-ali1927.html> (4 pages).

Decorator Combination Tamper-Resistant Nighlight/GFCI, White 1595NTL54WCC4. Datasheet [online]. Legrand. Retrieved May 17, 2012 from <http://www.legrand.us/PassAndSeymour/GFCI/GFCI-Receptacles/Tamper-Resistant/Combination-Nightlight-GFCI-Receptacle/1595NTLTRWCC4.aspx> (4 pages).

LED Night Light. Datasheet [online]. Feit Electric. Retrieved May 17, 2012 from <http://letsgogreen.biz/pages/nightlights.html> (2 pages).

Leviton Glow Guide Night Light. Datahseet [online]. Leviton. Retrieved May 17, 2012 from <http://www.amazon.com/Leviton-Glow-Guide-Night-Light/dp/B000GYF8XY/ref=sr_1_21?s=home-garden&ie=UTF8&qid=1299008596&sr=1-21> (6 pages).

NL3/LED Three LED Sensor Night Light plus 3-Plug Outlet. Datahseet [online]. Feit Electric. Retrieved May 17, 2012 from <http://www.amazon.com/Feit-Electric-NL3-LED-Sensor/dp-B000I1AC0E/ref=sr_1_48?s=home-garden&ie=UTF8&qid=1299008626&sr=1-48> (8 pages).

8 LED Nightlights. Datasheet [online]. Feit Electric. Retrieved May 17, 2012 from <http://www.amazon.com/Feit-Electric-8-LED-Nightlights/dp/B001OZ33FY/ref=sr_1_50?s=home-garden&ie=UTF8&qid=1299008671&sr=1-50> (6 pages).

"UL Warns of Night Light with Unauthorized UL Mark." The Associated Press news alert, Jul. 7, 2009 (4 pages).

"Pass & Seymour/Legrand Keeps Kids Safer with Over 100 Kinds of Tamper-Resistant Electrical Outlets." PR Newswire news alert, Feb. 1, 2008 (2 pages).

\* cited by examiner

RECEPTACLE COVER

CROSS-REFERENCE TO RELATED APPLICATIONS

This application claims priority to U.S. Non-Provisional patent application Ser. No. 15/275,641, filed Sep. 26, 2016, entitled "Receptacle Cover," which is a continuation of U.S. Non-Provisional patent application Ser. No. 14/158,322, filed Jan. 17, 2014, which issued Oct. 11, 2016 as U.S. Pat. No. 9,464,795, which is a continuation of U.S. Non-Provisional patent application Ser. No. 13/233,252, filed Sep. 15, 2011, which issued Mar. 11, 2014 as U.S. Pat. No. 8,668,347, which claims the benefit under 35 U.S.C. § 119(e) to U.S. Provisional Application Ser. No. 61/383,457, filed Sep. 16, 2010, each of which is incorporated by reference herein, in the entirety and for all purposes.

FIELD OF THE INVENTION

The present invention is generally directed to electric receptacles and switches. More particularly, the present invention is directed to an improved receptacle or switch cover having an integrated light and conductive tab members for quickly and easily and securely forming an electrical connection between the cover and an electric receptacle or light switch module.

BACKGROUND OF THE INVENTION

Unintentional injury in the home environment is a significant problem. "Underfoot accidents" is a phrase that is used to describe a class of accidents that includes slipping, tripping, falling, and other events causing injuries on stairs, floors, roofs, and the like.

The magnitude of this problem, i.e. falls related to poor lighting in the home environment, has been documented in numerous studies over the last several decades. The United States Health Service recorded 13.6 million falls in 1972. Poor lighting, tripping, and falling has been identified as a major cause of these injuries. One study found approximately 80 percent of floors in typical households are filled with "minor dangers" that represent major hazards. Data from the United States National Vital Statistics System during the period between 1992-1999 identified falls as the leading cause of unintentional injuries and the leading cause of death resulting in an average of eighteen thousand unintentional home injury deaths each year. In the general population, statistics show that about 60 percent of falls happen on same level slips and trips where an individual's foot strikes an object, causing the individual to lose his/her balance and fall due to an unexpected change in the contact between the individual's foot and the ground.

In 2000, traumatic brain injuries (TBI) and injuries to the hips, legs, and feet were the most common and costly fatal fall injuries, accounting for approximately 78% of fatalities and approximately 79% of costs. In the older population, one-in-three adults age 65 and older fall each year. Approximately 20-30% suffer moderate to severe injuries, and are hospitalized five times more often for fall-related injuries than they are for injuries from other causes. Furthermore, the total direct cost of all fall injuries for people 65 and older exceeded $19 billion in 2000. These costs are projected to reach $54.9 billion by 2020 (adjusted to 2007 dollars). The costs of Unintentional Home Injuries far outstrip both vehicle and workplace losses. In 2008 the average cost in wage and productivity losses in the United States was $63,500 for a disabling injury, $1.3 million for every death, and a staggering $3.3 million to the nation's economy for each injury case. Confirming this trend, a July 2008 American Geriatric Society report stated falls are "a leading cause of serious injury and death among elderly people in the United States, and most of those falls occur in the home." For our aging population, the most dangerous part of the house is the floor in living rooms, bedrooms, and hallways; stairways being the second most dangerous, followed by bathroom and kitchens. Many sources point to the lack of nightlights in familiar living spaces as a major problem.

Electricity is also a major cause in tens of thousands of injuries and deaths each year. The two most common causes of injury and death related to electricity are electrocutions and electrical fires. Citing statistics from the National Fire Protection Association, Michael G. Clendenin the executive director for the Electrical Safety Foundation International says each year the U.S. averages 111,400 home fires caused by faulty electrical distribution systems, electrical appliances, or heating and air conditioning systems. These fires account for approximately 860 deaths, 3,785 injuries, and $1.3 billion in property damage.

Although serious electric shock injuries among children may be rare, ensuring a safe environment for children in the places where they spend the majority of their time, i.e. at home and school/daycare, is a critical issue for every family. Safety tips to protect children from electrical hazards include plugging unused electrical outlets with safety caps and removing small appliances. Some small appliances such as a standard nightlight are necessary for safety and cannot be removed. However, nightlights often times attract the attention of young children.

In addition to safety, consumer convenience is also an important consideration when developing new products. A product that is safe but cumbersome to use or install will likely be found unpopular with consumers.

Furthermore, it may be advisable for developers of electrical products to monitor and ensure compliance with California's rigorous building codes (as they relate to energy saving devices) when designing new products.

Thus, what is needed is an improved receptacle/switch cover that provides the safety of an integrated light that is also easy to install for the do-it-yourself consumer.

BRIEF SUMMARY OF THE INVENTION

Figure 1:
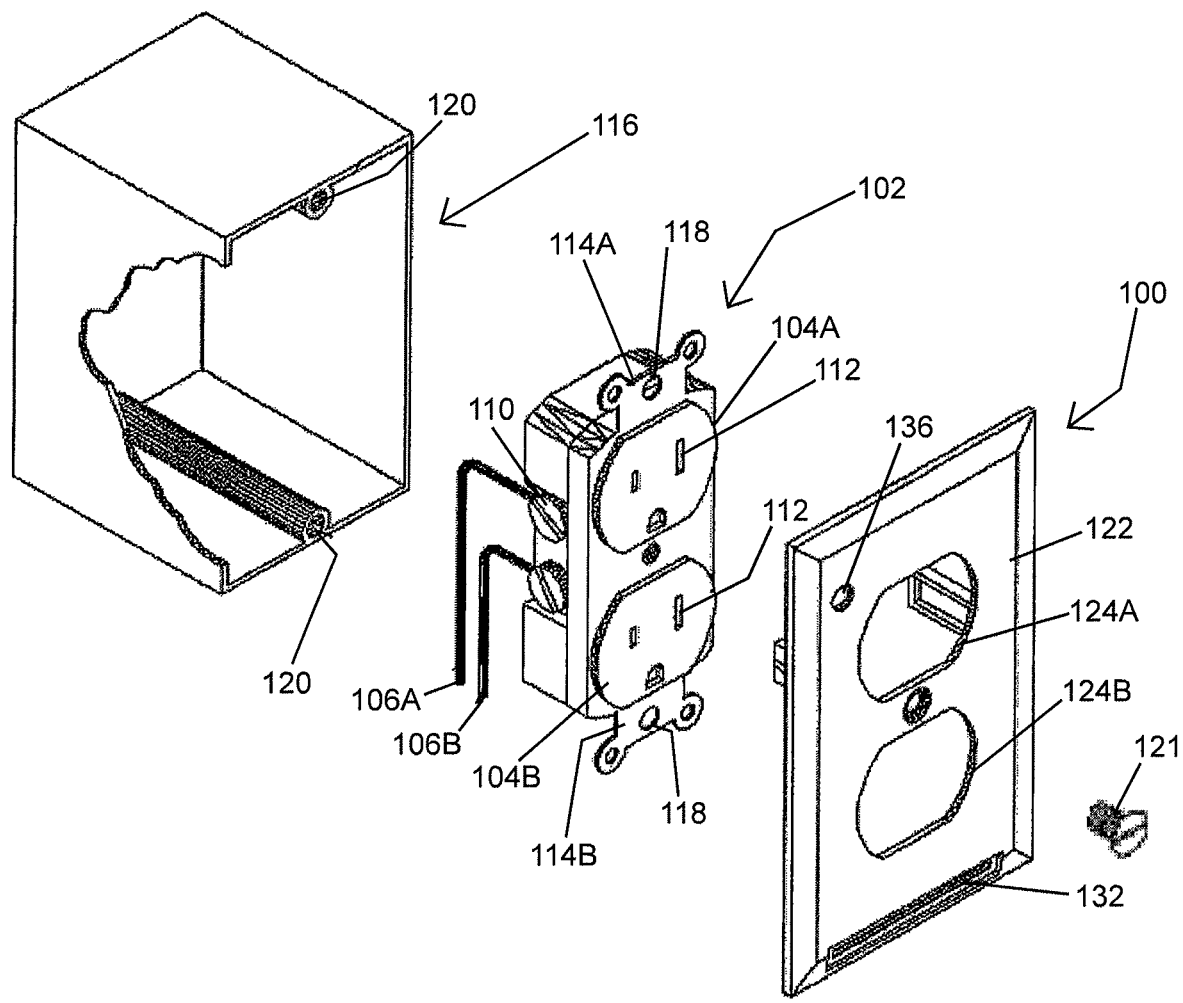
FIG. 1 is a front perspective exploded view of a first embodiment of a cover member configured as a receptacle cover, an electrical receptacle and a receptacle box.

The present disclosure addresses the foregoing problems by providing an improved receptacle/switch cover that includes an integrated light source, thereby reducing the potential of accidents and increasing safety in a home or commercial setting. Consider for a moment that commercial vessels and buildings such as ships, aircraft, and industrial facilities are all designed and built with emergency lighting systems, while residential homes are not despite countless unintended home injuries that occur every year. While existing home nightlight appliances are widely available and inexpensive, they are also cosmetic eyesores and unreliable given the likelihood they will break, burn out, not operate when power fails, and readily attract the attention of vulnerable toddlers and young children.

The receptacle/switch cover in accordance with the present disclosure addresses negative aspects of existing nightlight appliances with a simple "plug-and-play" installation that easily and quickly replaces existing receptacle or switch cover faceplates with a flush-mounted device that may be securely attached to an existing electrical receptacle or light switch. The receptacle/switch cover represents advances in electricity distribution and transmission geared towards reducing power from existing electric receptacles and switches in order to power the integrated light source (and potentially other low-power devices), while also enabling the convenient and safe transmission of power to a myriad of other electrical devices and appliances through the existing electric receptacle. In one exemplary embodiment, the receptacle/switch cover includes a light source comprising light emitting diodes ("LEDs"), voltage reducing integrated circuitry, and power transmission tabs all mounted on/within or integrated into the cover faceplate providing a safe, compact, and securely attached easy-to-install device.

DETAILED DESCRIPTION OF THE INVENTION

Overview

The present disclosure is directed to an electrical device that receives and/or converts the electrical output of consistent or variable domestic receptacles and/or switches that are hardwired to the main power of a building. In one example, a cover or plate may be configured to be operably connected to a power receptacle, such as an outlet or switch. In some implementations, the cover may be connected to a standard electrical socket and may provide a conversion between AC power to DC power. The cover or plate may further include transmission tabs or other transmission members that transfer or conduct electricity from a power source (e.g., AC electrical power source) to an element, circuit or other electrical devices.

In some instances the cover may include an integrated light in electrical communication with the transmission tab. The integrated light may eliminate the need for using a standard nightlight, which may create a safer environment for children. Additionally, the integrated light feature may eliminate or reduce a concern about children tampering with removable nightlights. This is because the cover may be securely connected to the outlet receptacle by the same means as do traditional or conventional covers do and may be difficult for a child to remove. Moreover, with an additional safety cover for covering a screw of the cover member, this may make it even less likely for this to occur.

In other examples, the cover may include additional ports or receivers for a plug or connector. The cover may include additional plug receivers or outlets, universal serial bus (USB) cable receivers, or other electronic cables or connectors that may require a power source.

Detailed Description

Figure 2:
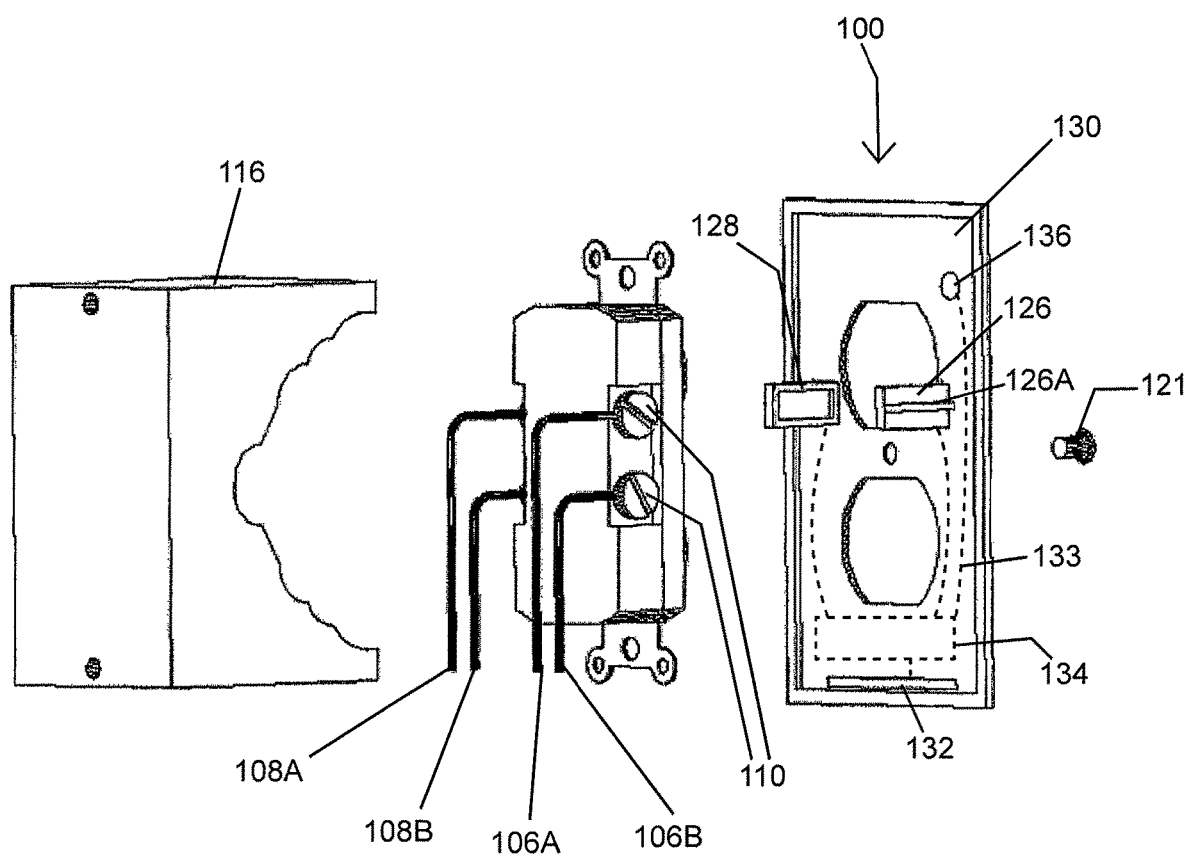
FIG. 2 is a rear perspective exploded view of the receptacle cover, the electrical receptacle and the receptacle box of FIG. 1.

FIGS. 1 and 2 are exploded perspective views of one exemplary embodiment of a receptacle cover 100 in accordance with the present disclosure that is attachable to a standard electric receptacle 102. Particularly, FIG. 1 is front perspective view while FIG. 2 is a rear perspective view.

As may be appreciated by those skilled in the art, the electric receptacles are devices for removably connecting electrically operated devices to the power supply. The exemplary receptacle 102 illustrated in FIGS. 1 and 2 includes first female connector 104A and a second female connector 104B or sockets electrically coupled to a "hot" or "AC in" line 106A, 106B and a "neutral" or "AC out" line 108A, 108B. The hot lines 106A, 106B are connected to a power source such as a transformer connected to a power grid, a generator, or the like. Additionally, the voltage for the hot lines 106A, 106B may be varied depending on the country, power source, or application.

The female connectors 104A, 104B may also be connected to a ground line. For example, although not shown, the bottom "U-shaped" portion of the female connectors 104A, 104B is attachable to the ground line. The pair of hot lines 106A, 106B is coupled to the electric receptacle 102 with a corresponding pair of electrically conductive receptacle fasteners 110. Similarly, the pair of neutral lines 108A, 108B is coupled to the electric receptacle 102 with a corresponding pair of electrically conductive receptacle fasteners 110.

The female connectors 104A, 104B have slots 112 or apertures which provide a connection point or outlet for providing access to the power source. A plug, cable, or other device including electrical contacts may be inserted into the slots 112 in order to be provided power from the power source. Specifically, upon connection to the hot and neutral lines 106A, 106B, 108A, 108B, the female connectors 104A, 104B deliver current to the plug, prongs, or other electrical contact for the plug or cable (not shown) which is inserted therein. In some examples, the female connectors 104A, 104B are configured to receive a male electrical connector including contact prongs for mechanical and electrical connection to the slots 112 or holes in the corresponding female connector 104A, 104B. It should be noted that in some examples, the female connectors 104A, 104B of the cover 100 may be replaced by male connectors.

The electric receptacle 102 includes first and second mounting flanges 114A, 114B for mounting the electric receptacle 102 to a receptacle box 116. Particularly, the mounting flanges 114A, 114B may each include a receptacle mounting aperture 118 that aligns with a corresponding mounting aperture 120 in the receptacle box. As will be appreciated by those skilled in the art, the electric receptacle 102 may be mounted to the receptacle box 116 by threading a mounting fastener 121 (e.g., screw, bolt, nail) through each of the receptacle mounting apertures 118 and into the corresponding aperture 120 in the receptacle box 120.

It should be understood that the particular configuration of the electric receptacle 102 and receptacle box 116 as shown in FIGS. 1 and 2 is presented merely for purposes of example and not limitation. For example, the receptacle box 116 includes a cutout along a right side in order to show the power lines and connections, but in many applications, the receptacle box 116 may not include a side cutout. Thus, the cover 100 may be adapted for use with electric receptacles that conform to the standards of any country (such as standards for voltage, frequency, and slot/pin configuration).

In some examples, the electric receptacle 102 may be a GFI (ground fault interrupter) receptacle. In this case, the tabs 126, 128 may be configured with a design, position and length that accommodates the GFI/GFCI receptacle body and the common/neutral line and hot/positive line contact points. For example, because GFI/GFCI receptacles have an elongated square body, the outside dimensions of the cover member may be a relatively larger to accommodate the circuitry.

The cover member circuitry may be operable when the GFI/GFCI receptacle has tripped, for example, as long as the tabs contact the main common/neutral and hot/positive contact points/leads. In cases where the circuit(s) at the main breaker panel have tripped, the cover member circuitry may be rendered inoperable, e.g., due to the downstream/inline circuitry being rendered inoperable (just as it is designed to do). Moreover the cover member circuitry may be configured as low voltage circuitry.

As illustrated in FIGS. 1 and 2, the receptacle cover 100 may include a generally flat faceplate 122 having first and second openings 124A, 124B that are sized and dimensioned for providing access to the first and second female connectors 104A, 104B of the electric receptacle 102. The particular shape of the openings 124A, 124B in FIGS. 1 and 2 is presented merely for purposes of example. Thus, in alternative embodiments the openings 124A, 124B may be rectangular, circular, or the like without departing from the intended scope of the present disclosure. Additionally, depending on the electrical receptacle 102, the cover 100 may only include a single opening rather than two openings, e.g., if the electrical receptacle 102 includes only a single female connector. As will be illustrated in further detail below, the receptacle cover 100 may be coupled to the electric receptacle 102 by threading a fastener through an aperture in the faceplate 122 and into a corresponding aperture in the electric receptacle 102. However, the cover 100 may be operably connected to the electrical receptacle 102 in many other manners, e.g., multiple fasteners, hook and loop, adhesive, and so on.

The receptacle cover 100 includes a transmission tab or a plurality of power transmission tabs 126, 128 extending from a rear surface 130 of the cover 100. As most clearly illustrated in FIG. 2, the receptacle cover 100 includes a first power transmission tab 126 that is structured for connection to one of the electrically conductive receptacle fasteners 110 coupled to a hot line 106A, 106B and a second power transmission tab 128 that is structured for connection to one of the electrically conductive receptacle fasteners 110 coupled to a neutral line 108A, 108B. The power transmission tabs 126, 128 may be designed in any suitable manner that provides a point of contact between the receptacle cover 100 and the electrically conductive receptacle fasteners 110.

In some embodiments, the power transmission tabs 126, 128 may extend outwardly away and at a right angle from the back of the rear surface 130 of the cover 100. The power transmission tabs 126, 128 may have an elongated shape, e.g., an elongated rectangular shape, with one or more reinforcement ribs such as reinforcement rib 126A illustrated in FIG. 2. While the power transmission tabs 126, 128 are illustrated as having a rectangular profile, the power transmission tabs 126, 128 may have a square profile, a tapering profile, a triangular profile, and so on. The power transmission tabs 126, 128 may include one or more conductive surface structures facing the conductive surface of the electric receptacle 102 to which the transmission tabs 126, 128 are to contact when joined to the electric receptacle 102. For example, the transmission tab 28 in FIG. 2 illustrates a rectangular shaped conductive protrusion extending around the periphery of the inner side of the elongated rectangular transmission tab 128, which may facilitate electrical contact with the first neutral line 108A or its corresponding electrically conductive receptacle fastener 110, described below. In addition, the power transmission tabs 126, 128 may include other conductive surface structures, such as one or more protrusions, hooks, teeth, and the like for facilitating electrical contact with the first hot line 106A, and the first neutral line 108A or their corresponding electrically conductive receptacle fasteners 110.

In one embodiment, the power transmission tabs 126, 128 are manufactured from a suitable conductive material, such as steel or brass, and may be plated with zinc, tin, nickel, or the like. As will be appreciated by those skilled in the art, any suitable material that allows for the transmission of current from the power source to the receptacle cover 100 may be used without departing from the intended scope of the present disclosure. The entire tab 126, 128 may be formed of an electrically conductive material. Alternatively, the tab 126, 128 may be formed from a non-conductive or insulative material and the electrically conductive material provided as an insert that is coupled thereto or embedded therein.

In order to accommodate for slight variations in the width of different electric receptacles 102 and ensure sufficient contact, the power transmission tabs 126, 128 may be structured to allow for a limited amount of outward bending from a normally "biased" position as illustrated in FIG. 2. Thus, the power transmission tabs 126, 128 may be substantially rigid but may bend outwardly and then "spring back" to their normal positions. In these examples, the transmission tabs 126, 128 may be resilient and/or semi-flexible to provide the "spring back" reaction once the cover 100 is coupled to the electrical receptacle 102.

The power transmission tabs 126, 128 electrically couple the power source to the receptacle cover 100. It should be noted that although the tabs 126, 128 provide power to the cover 100, that the faceplate 122 and other outward facing components of the cover 100 may be insulated from the tabs 126, 128. This may prevent the tabs 126, 128 from providing electricity to components that may come into contact with a user or otherwise may cause an unintended shock.

The power from the hot lines 106A, 106B and neutral lines 108A, 108B may be routed to a voltage reducing circuitry 134 that may be embedded within or coupled to the receptacle cover 100 in any suitable manner. The circuitry 134 may be in communication via a connection wire 133 (or other device) with the transmission tabs 126, 128, the sensor 136, and the light source 132. In this manner, the circuitry 134 may reduce the voltage from the transmission tabs 126, 128 but also control, provide power to, and/or facilitate communication between the sensor 136 and the light source 132.

In addition to reducing the voltage, the circuitry 134 may also be operable to convert the AC voltage to DC voltage (i.e. provide a DC power supply). The DC power supply may be used to power various devices including, but not limited to, a light source integrated into the faceplate 122 of the cover 100, a USB cable connected to an electronic device, a sensor, an air freshener device, and so on.

With continued reference to FIGS. 1 and 2, the cover 100 may also include a light source 132. The light source 132 may be in communication with the circuitry 134 and/or the transmission tabs 126, 128. The light source 132 may also be operably connected to the faceplate 122 such that at least a portion of light emitted from the light source 132 may be visible when the cover 100 is operably connected to the electric receptacle 102. In one example, the cover 100 may include a light source aperture or slot to expose at least a portion of the light source 132. Furthermore, in other examples, the light source 132 may be configured to be exposed around the sides of the faceplate 122, such that the cover 100 may be backlit.

The light source 132 may be substantially any type of light source; however, in some examples, a light emitting diode (LED) light source may be preferable due to its long life and low power consumption. If the light source 132 is a LED, the voltage reducing circuitry 134 may only need to convert and reduce the voltage to about 3-12 volts DC. The light source 132 may be other types of LEDs, such as a LED power chip, LED revolution light sheets, LED panel, or LEDS embedded in or between another panel.

Additionally, the light source 132 may be substantially any shape or size. In some examples, the light source 132 may be a "light bar" or "light diffuser" (e.g., one or more LED lights may be positioned behind a transparent barrier). The light source 132 is shown in FIGS. 1 and 2 as a light diffuser or light bar, but merely for purposes of example and not limitation. In other examples, the faceplate 122 may be formed substantially (or completely) of the light source 132. For example, the faceplate 122 may be formed of a self-illuminating plastic material, a plastic material that illuminates upon application of a voltage, a LED plastic sheet, or translucent/electroluminescent material (e.g., electroluminescent panel), or may be coated with an illuminating material. Thus, substantially any suitable light source 132 configuration may be used, which may include single or multiple bulbs, diodes, or other sources.

In one exemplary embodiment as illustrated in FIGS. 1 and 2, the electric receptacle may further include a sensor 136, such as a photosensor or photodetector in communication with the light source 136. As appreciated by those skilled in the art, photosensors or photodetectors are electronic components that are operable to detect the presence of visible light, ultraviolet energy, infrared energy, or the like. Thus, when the sensor 136 is a photosensor or photodetector, the sensor 136 may function to detect the level of light within a room and automatically switch the light source 132 on/off accordingly. In this example, the light source 132 may be automatically turned on or off depending on the ambient light within the room. This may allow the light source 132 to be activated at night to provide a "night light" or source of light in a dark room, and turned off when the room has a light turned on or during the day.

In other examples, the sensor 136 may be a motion detector, which may allow the light source 132 to be activated when there is movement near the cover 100. This may allow the light source 132 to be turned on if a user is walking near the cover 100, which may provide illumination for a predetermined area near the cover 100.

In some examples, the cover 100 may include an on/off switch that may be coupled to the sensor 136 and/or the light source 132. For example, in some instances, the on/off switch may activate the light source 132 and may override the sensor 136. Similarly, this may allow the sensor 136 to be deactivated so that the light source 132 may not be turned on even if there is an event which would normally have the sensor 136 trigger the light source 132 (e.g., motion, decrease in ambient light).

Figure 3:
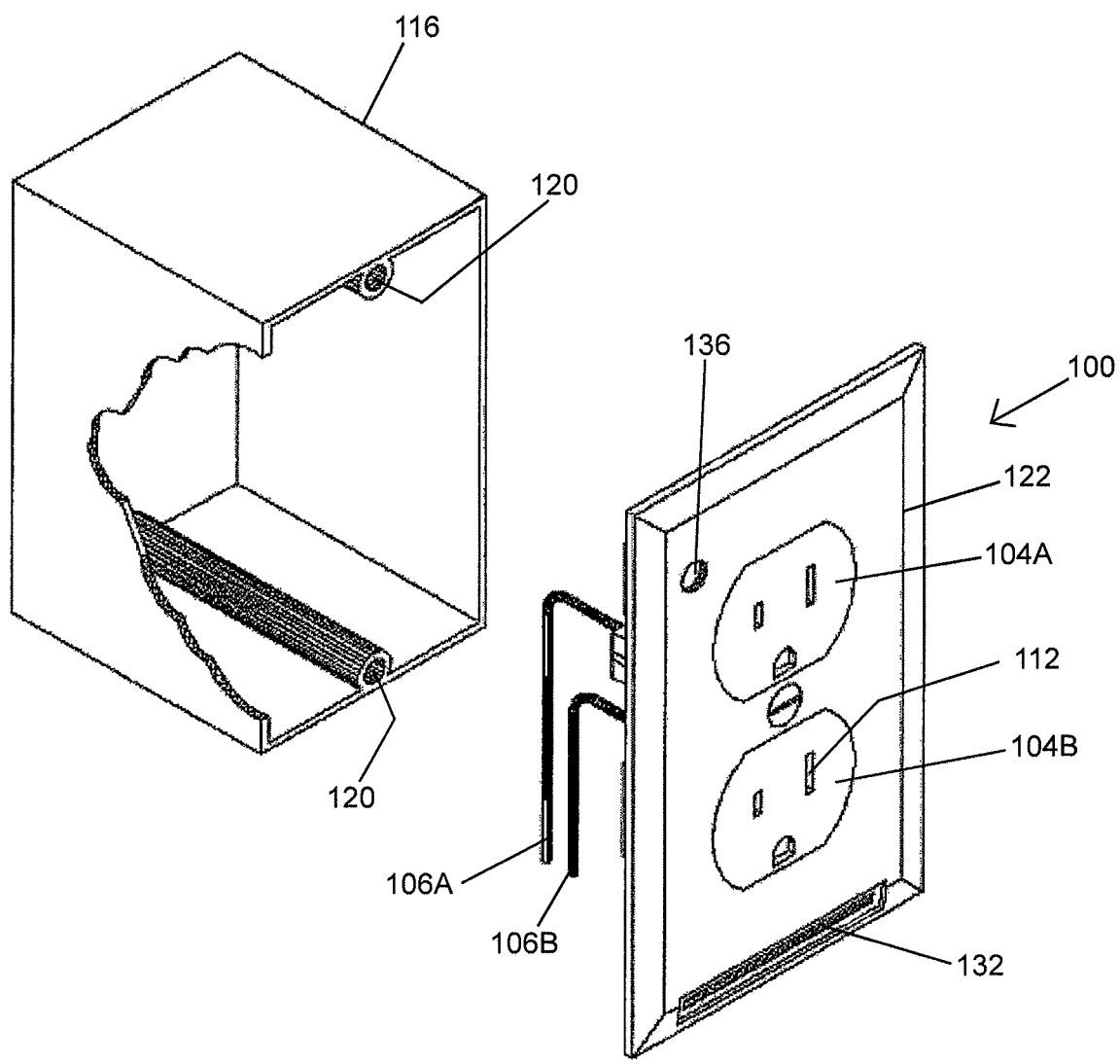
FIG. 3 is a front perspective view of the receptacle cover joined to the electrical receptacle of FIG. 1 but detached from the receptacle box.
Figure 4:
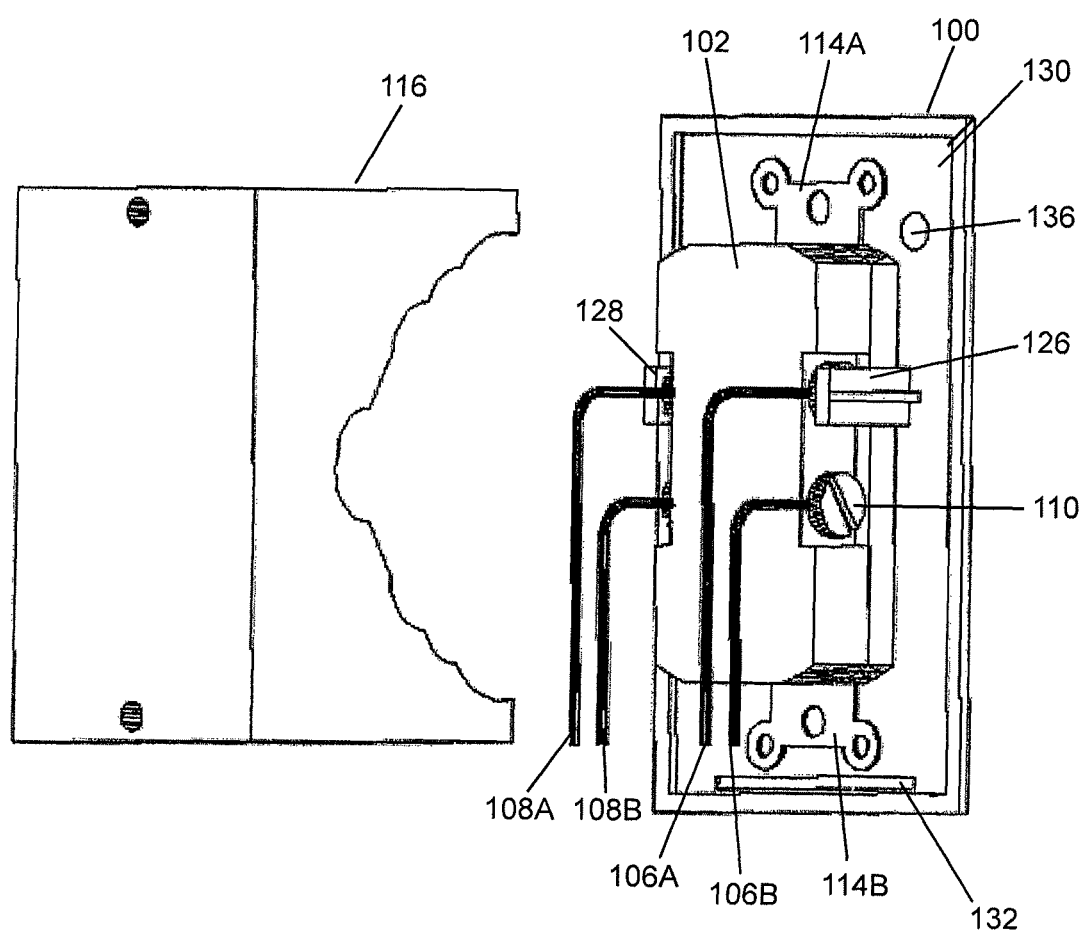
FIG. 4 is a rear perspective view of the receptacle cover joined to the electrical receptacle of FIG. 1 but detached from the receptacle box.

FIGS. 3 and 4 are front and rear perspective views of the exemplary receptacle cover 100 in operably coupled or connected to the electric receptacle 102. As illustrated in FIGS. 3 and 4, when the cover 100 is operably connected to the electrical receptacle 102, the first power transmission tab 126 of the receptacle cover is in electrical contact with one of the electrically conductive receptacle fasteners 110 coupled to a hot line 106A and the second power transmission tab 128 of the receptacle cover 100 is in electrical contact with one of the electrically conductive receptacle fasteners 110 coupled to a neutral line 108A. In this configuration, the receptacle cover receives input power from the power source through the power transmission tabs 126, 128, thereby providing a source of power for operating the light source 132, sensor 136, and/or other devices that operate on low voltage DC power.

As shown in FIGS. 1, 2 and 4, the cover 100 includes only two transmission tabs 126, 128 that may be coupled to the first hot line 106A, and first neutral line 108A. However, it should be noted that in other examples, the cover 100 may include a second set of tabs that may be coupled to the second hot line 106B, and second neutral line 108A, respectively. In these examples, the first set of transmission tabs 126, 128 may provide power to a first set of one or more devices or elements and the second set of transmission tabs (not shown) may provide power to a second set of one or more devices or elements different from the first set. Similarly, the cover 100 may include a set of transmission tabs for each connector on the electrical receptacle 102, so that if the electrical receptacle 102 includes multiple outlets there may be multiple transmission tab sets.

Figure 5:
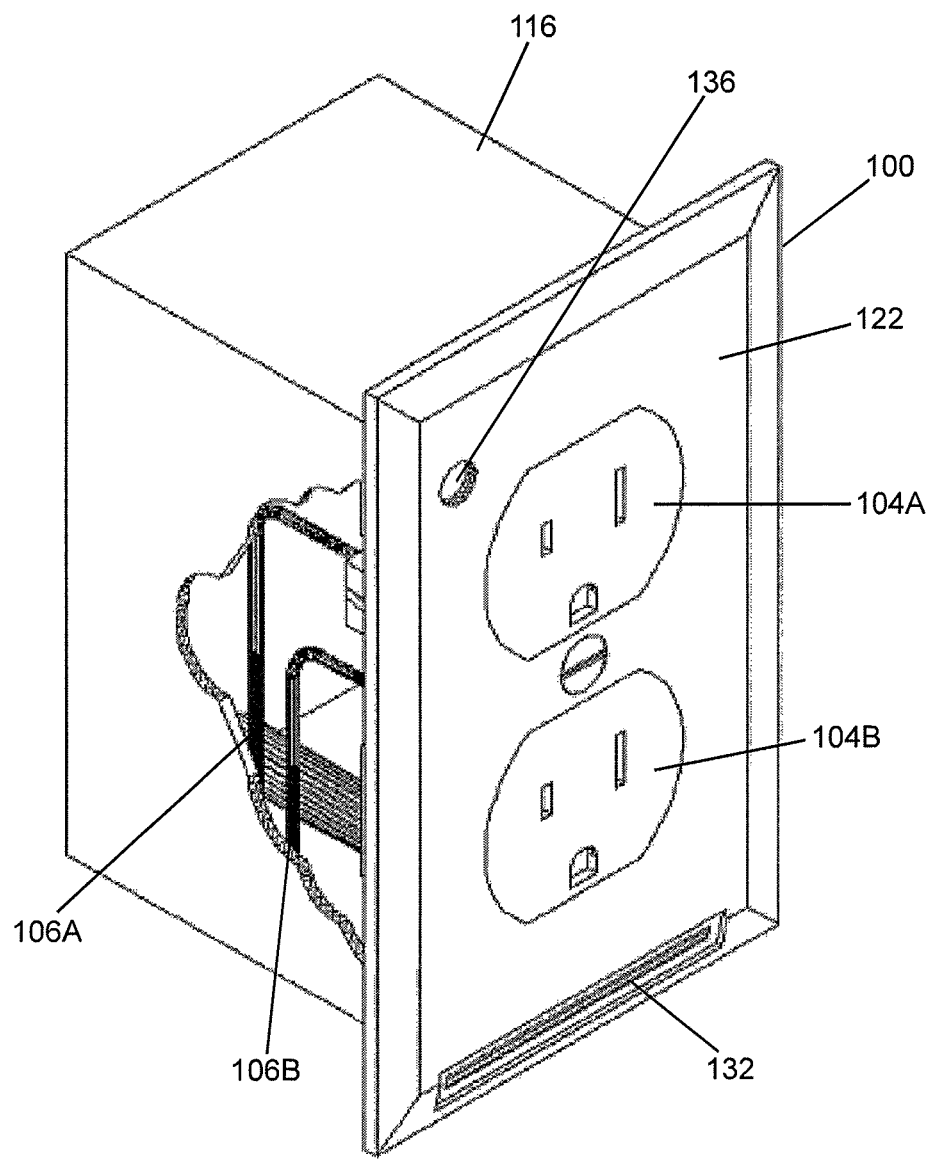
FIG. 5 is a front perspective view of the receptacle cover, the electrical receptacle and the receptacle box of FIG. 1 coupled.
Figure 6:
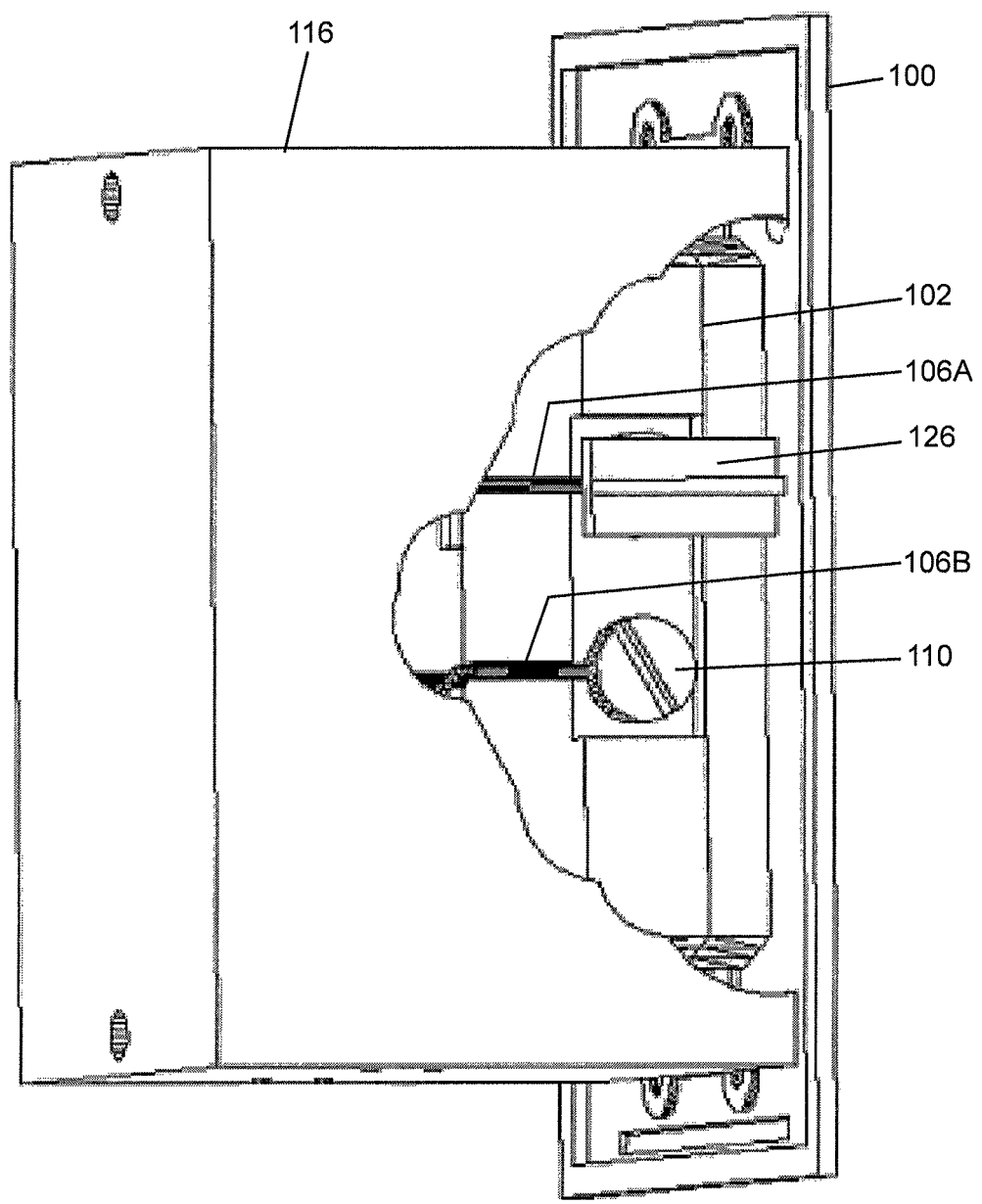
FIG. 6 is a rear perspective view of the receptacle cover, the electrical receptacle and the receptacle box of FIG. 1 coupled.

FIGS. 5 and 6 are front and rear perspective views of the electric receptacle 102 and the receptacle cover 100 coupled to the receptacle box 116. When the electric receptacle 102 and the cover 100 are operably coupled to the receptacle box 116, the receptacle box 116 may be substantially hidden from view. Additionally, only the connectors 104A, 104B of the electric receptacle 102 may be viewable through the cover 100. This may allow the cover 100 to provide an aesthetically pleasing appearance to the electrical outlet, as the internal components may be hidden from view. Additionally, the faceplate 122 of the cover 100 may also prevent the internal components from being accessed by people, animals, or the like. This is especially true when the receptacle box 116 is installed within a wall or other structure.

Alternative Examples of the Receptacle Cover

Now that one exemplary embodiment of the receptacle cover 100 has been described in detail, several alternative embodiments will be illustrated. Although only a limited number of alternative embodiments will be illustrated herein, it will be obvious to those skilled in the art that any type of receptacle that provides a source of power may utilize the power transmission tabs 126, 128 and the integrated light source 132 without departing from the intended scope of the present disclosure.

Figure 7:
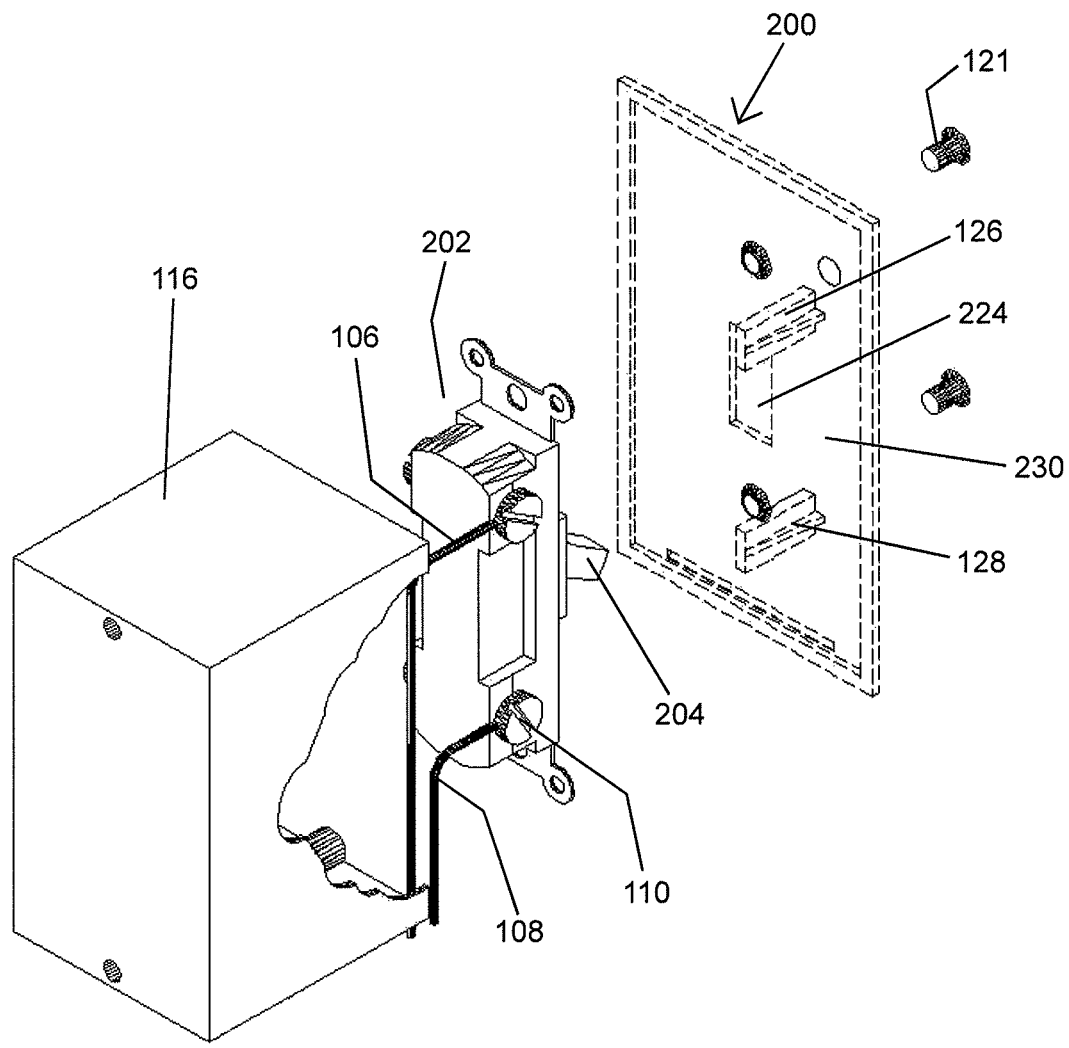
FIG. 7 is an exploded perspective view of another embodiment of a cover member configured as a switch cover, a switch receptacle and a receptacle box.

In one example, the receptacle cover may be operably connected to a switch outlet, e.g., a light switch outlet. FIG. 7 is an exploded perspective view of a first alternative cover 200. Particularly, the cover 102 of FIG. 7 may be substantially similar in structure and function to the cover 100 of FIGS. 1-6, but the cover 200 may be operably connected to a switch receptacle 202 including a switch 204, rather than an electric receptacle cover. Thus, in this example, the two openings 124A, 124B for receiving the two connectors 104A, 104B are replaced with a single switch opening 224. The switch 204 may then extend through the opening 224 when the cover 200 is operably connected to the switch receptacle 202. In this manner the switch 204 may be accessible and movable even when the cover 200 is connected.

In some instances, the hot line 106 and the neutral line 108 are typically coupled on the same side of a light switch receptacle 202. Therefore, in the cover 200, the power transmission tabs 126, 128 extend from a same side of the rear face 230. The power transmission tabs 126, 128 may be designated as "upper" and "lower" tabs 126, 128, such that the first or higher transmission tab 126 connects to the hot line 106 and the second or lower transmission tab 128 connects to the neutral line 108.

Additionally, in some embodiments, the cover 200 may include one more additional tabs (not shown) extending from the rear surface 230 of the cover 200. These additional tabs may allow a single cover 200 to be able to be connected to a electric receptacle and a switch receptacle 202. However, in FIG. 7, the cover 200 may be connected to the switch receptacle 202, the additional or "dummy tabs" are not shown. Furthermore, in other embodiments, the additional tabs may not provide a connection but may be used to balance a "clipping pressure" or connecting pressure when a user connects the cover 200 to the receptacle 202 and help to ensure proper alignment of the cover 202.

Figure 8:
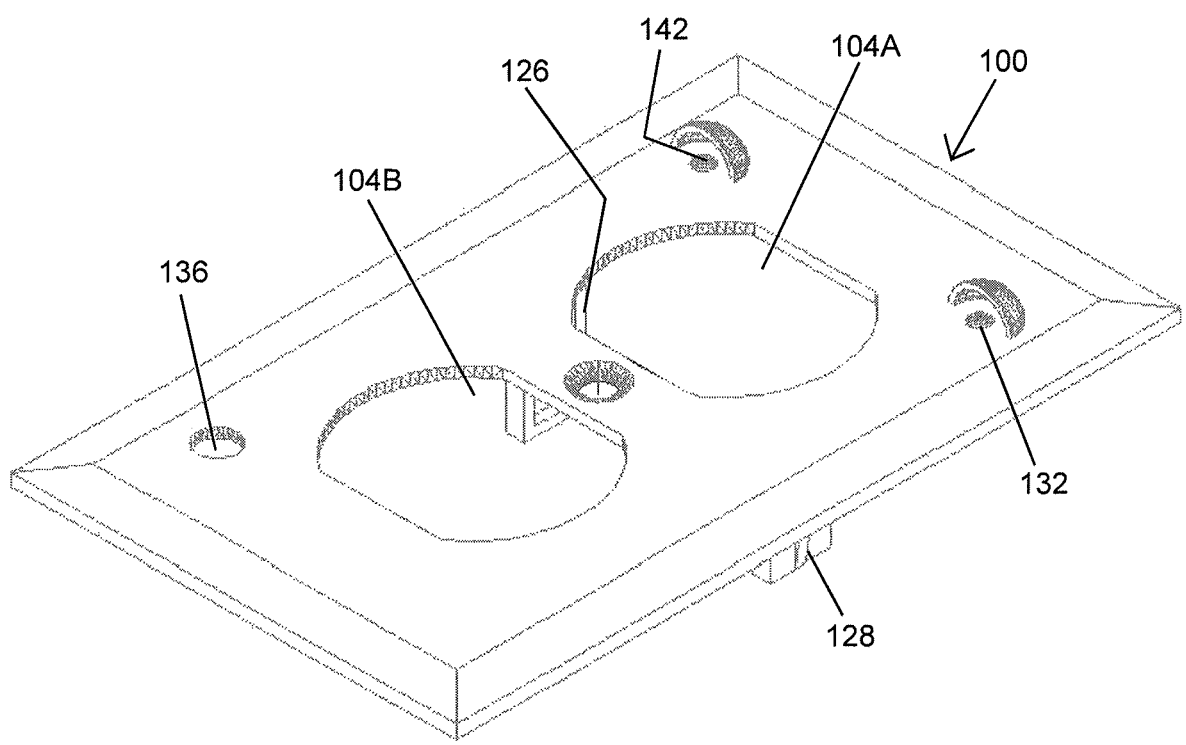
FIG. 8 is a perspective view of another embodiment of a cover member configured as a receptacle cover with two lights.
Figure 9:
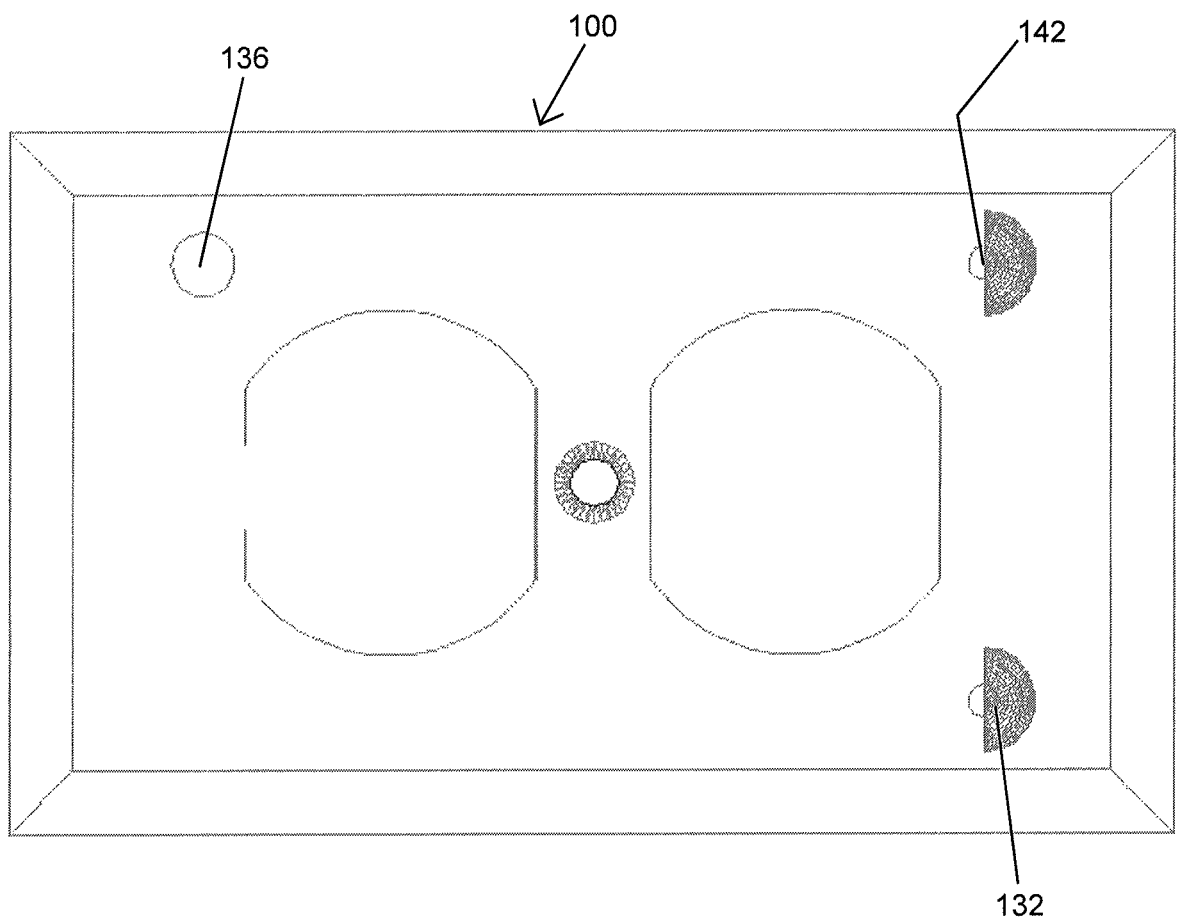
FIG. 9 is an elevation view of the cover member of FIG. 8.
Figure 10:
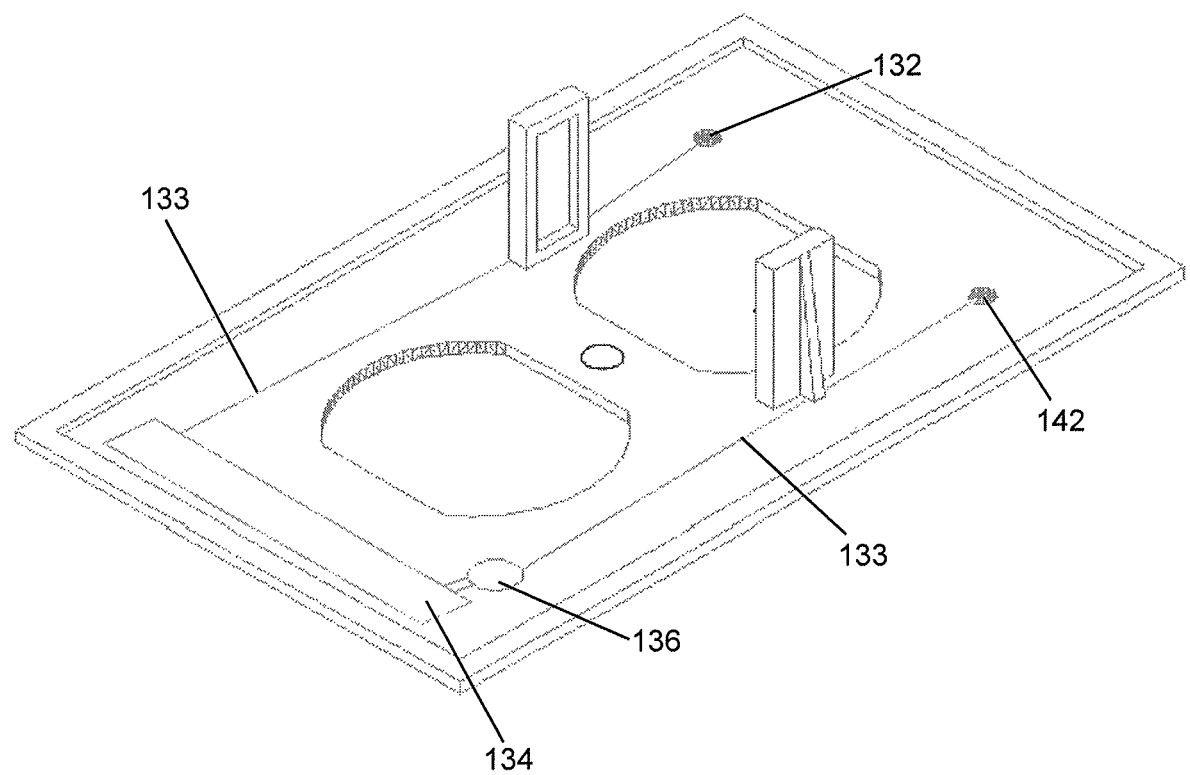
FIG. 10 is a rear perspective view of the cover member of FIG. 8.

In other examples, the cover may include multiple light sources spaced at various locations on the cover. FIG. 8 is a top perspective view of the cover 100 of FIG. 1 having an additional light source. FIG. 9 is front elevation view of the cover 100 of FIG. 8. FIG. 10 is a rear perspective view of the cover 100 of FIG. 8. As shown in FIGS. 8-10, the cover 100 may include a second light source 142, which may be spaced apart from the first light source 132. In one example, both light sources 132, 142 may be positioned on a top side of the faceplate 122. However, as will be appreciated by those skilled in the art, the light source(s) 132, 142 may be placed anywhere on the cover 100.

Figure 11:
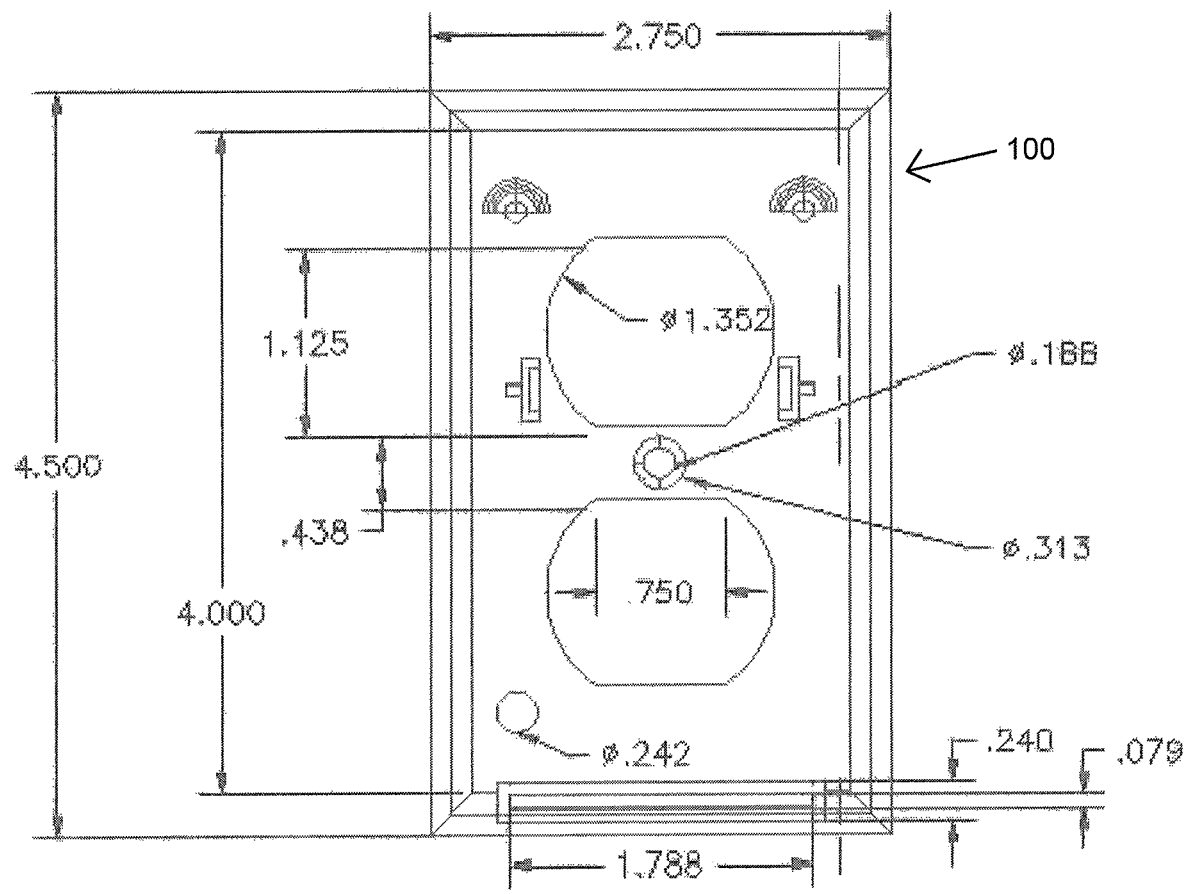
FIG. 11 is a front elevation view of the cover member of FIG. 8 setting forth exemplary dimensions.
Figure 12:
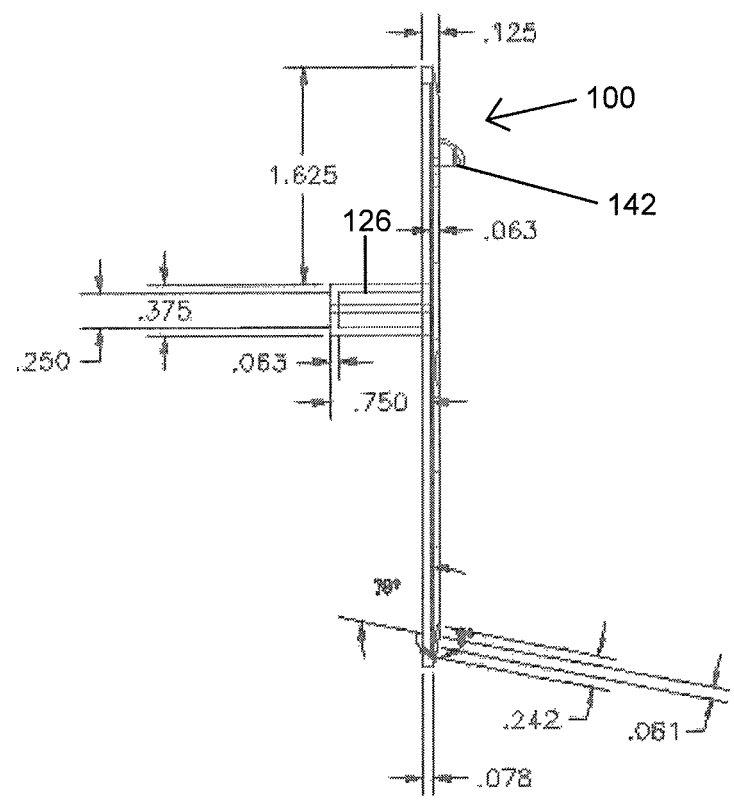
FIG. 12 is a right side elevation view of the cover member of FIG. 8 setting forth exemplary dimensions for the cover member.
Figure 13:
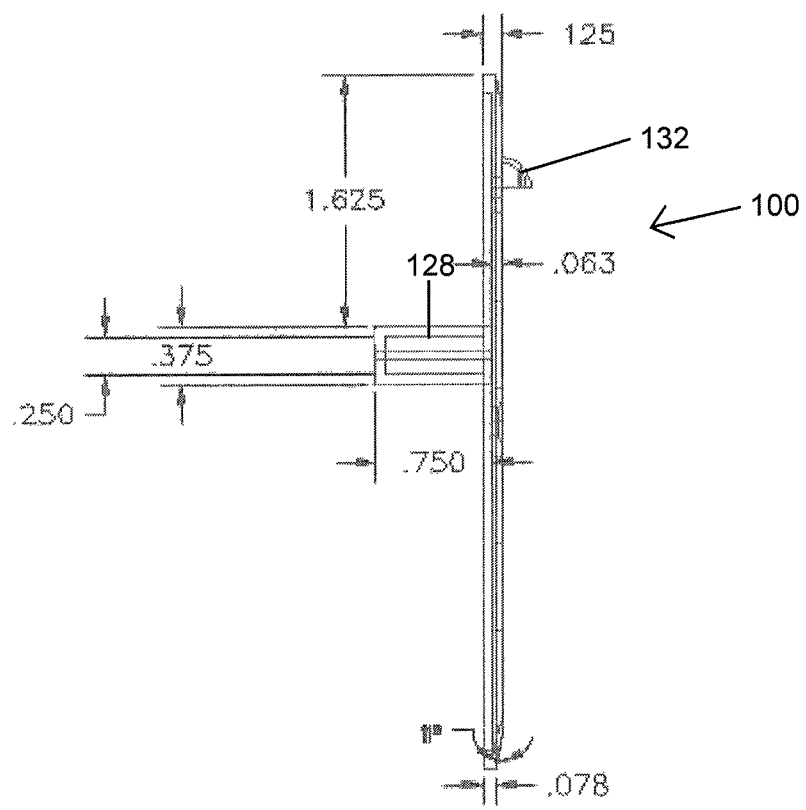
FIG. 13 is a left side elevation view of the cover member of FIG. 8 setting forth exemplary dimensions for the cover member.

FIGS. 11-13 set forth exemplary dimensions for the receptacle cover 100. It should be noted that the dimensions as illustrated in FIGS. 11-13 are merely one example and may be dependent on the shape, size, and/or type of the electric receptacle 102 and/or receptacle box 116. Therefore, the dimensions illustrated in FIGS. 11-13 are intended to be non-limiting and provide a single example of the cover 100.

Figure 14:
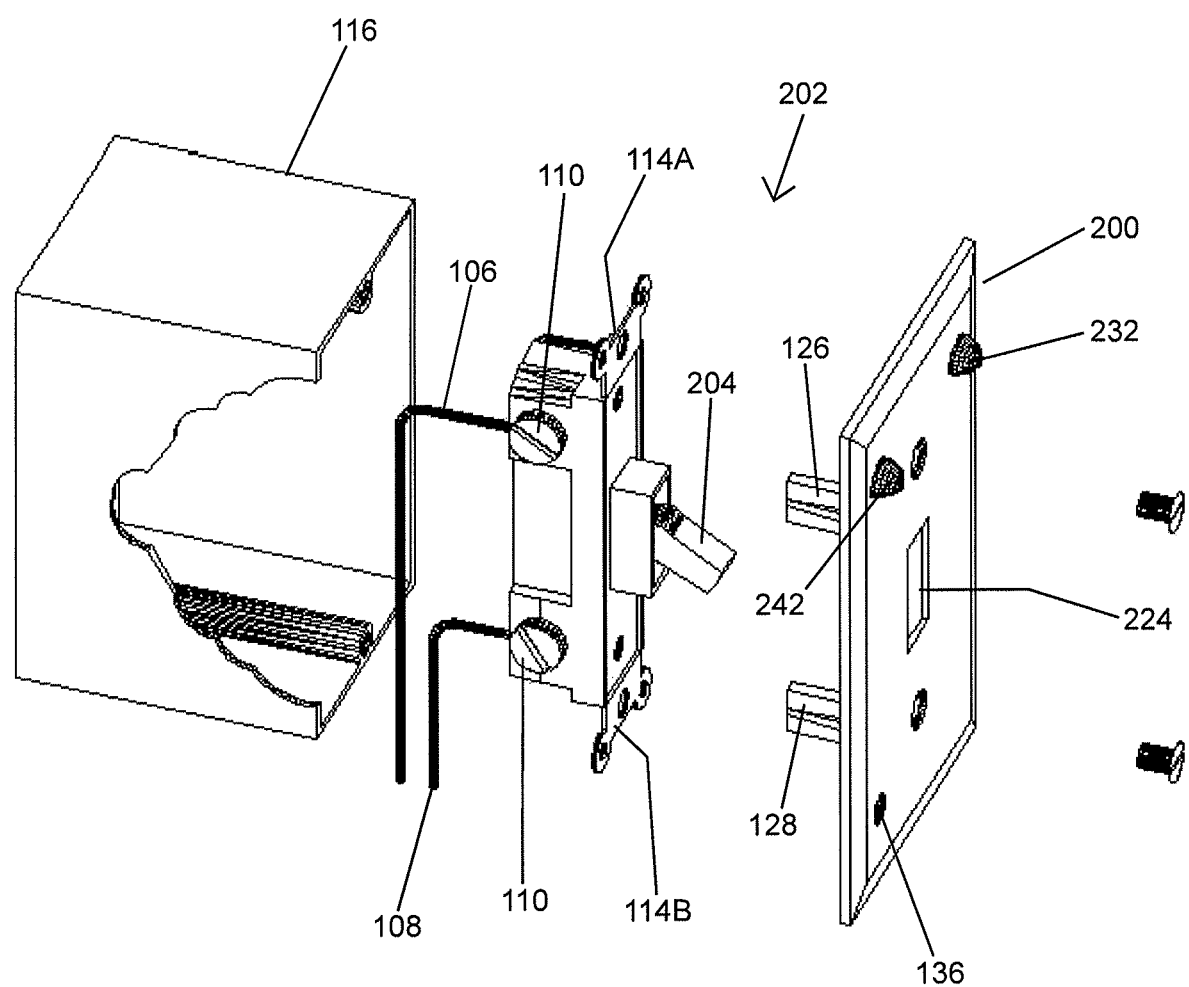
FIG. 14 is an exploded view of another embodiment of a cover member configured as a switch cover, a switch receptacle and a receptacle box.
Figure 15:
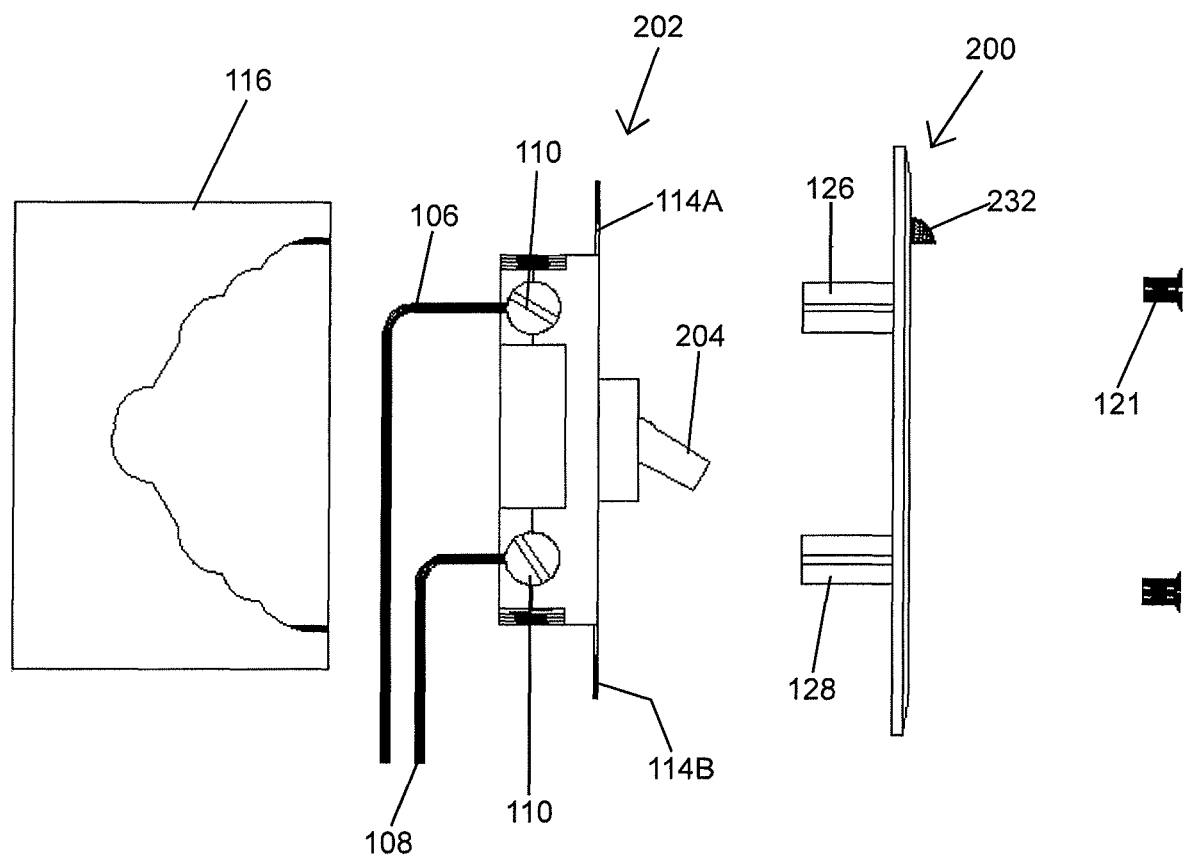
FIG. 15 is an exploded side elevation view of the switch cover, the switch receptacle and the receptacle box of FIG. 14.

Similar to the cover 100 shown in FIGS. 8-10, the cover 200 for a switch receptacle 202 may include multiple light sources 232, 242. FIGS. 14-15 illustrate the cover 200 of FIG. 7 including a second light source 242.

Figure 16A:
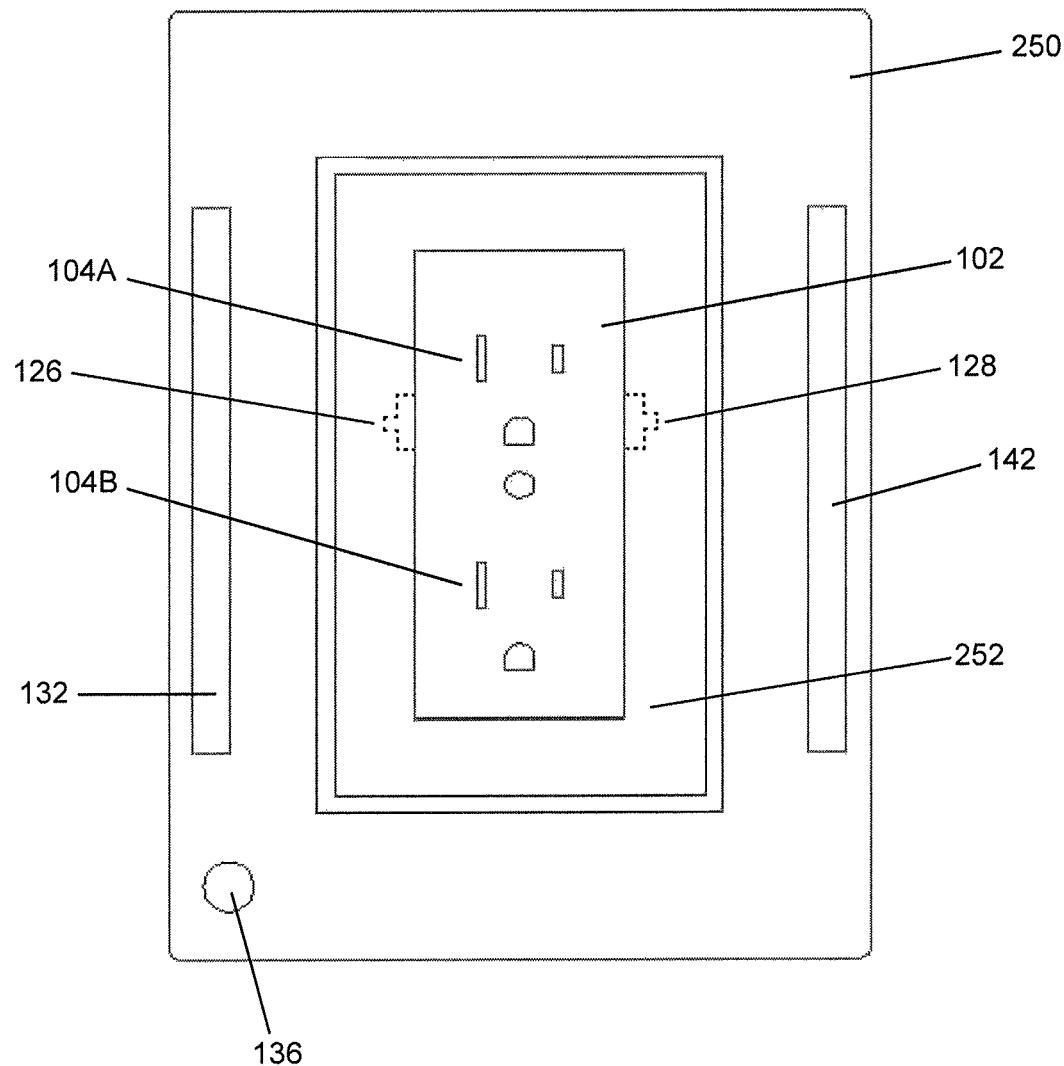
FIG. 16A is a front elevation view of another embodiment of the cover member configured as an "under-plate" positioned between the electrical receptacle and the wallplate.
Figure 16B:
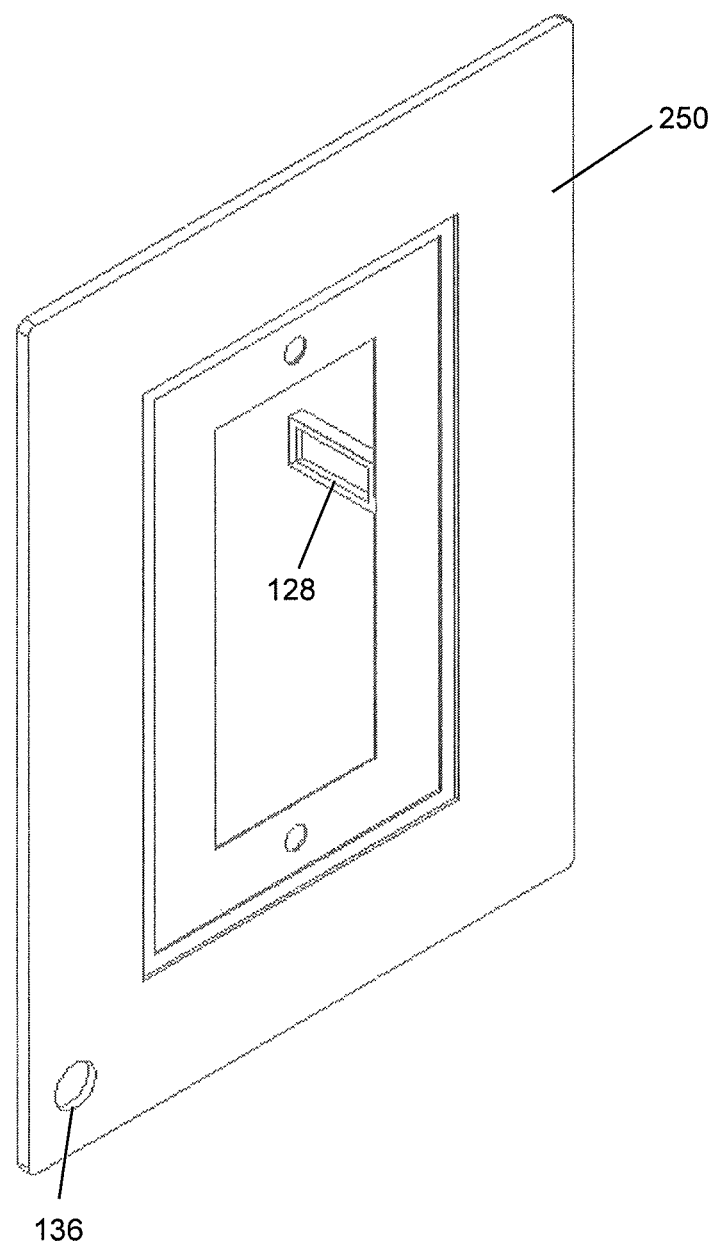
FIG. 16B is a front isometric view of the cover member of FIG. 16A.

In other examples, the cover may also be used in addition to a conventional receptacle cover or wallplate 252 for an electric receptacle 102. FIGS. 16A and 16B illustrates a cover member 250 that may be connected to the electric receptacle 102 and a wallplate 252. The wallplate 252 may provide for a covering of the electric receptacle 102, e.g., to hide the mounting flanges 114A, 114B as well as provide an aesthetic appearance. The cover 250 may be positioned between the wallplate 252 and the electric receptacle 102. The cover 250 may include the power transmission tabs 126, 128, light source 132, and sensor 136, but may be used in addition to the wallplate 252.

The cover 250 may be an "under-plate" and may be positioned between the electric receptacle 102 and the wallplate 252. As illustrated in FIG. 16A, the light sources 132, 134 may be positioned on either side of the connectors 104A, 104B so as to flank the sides of each exposed connector 104A, 104B. However, in other examples the light sources 132, 134 may be positioned at substantially any location on the cover 250. Furthermore, as shown in FIG. 16A, the cover 250 is configured to be received over the electric receptacle 102; however, those skilled in the art will appreciate that a similar under-plate style cover may alternatively be used to provide lighting around a standard light switch cover, as well as other power outlet receptacles.

Figure 17:
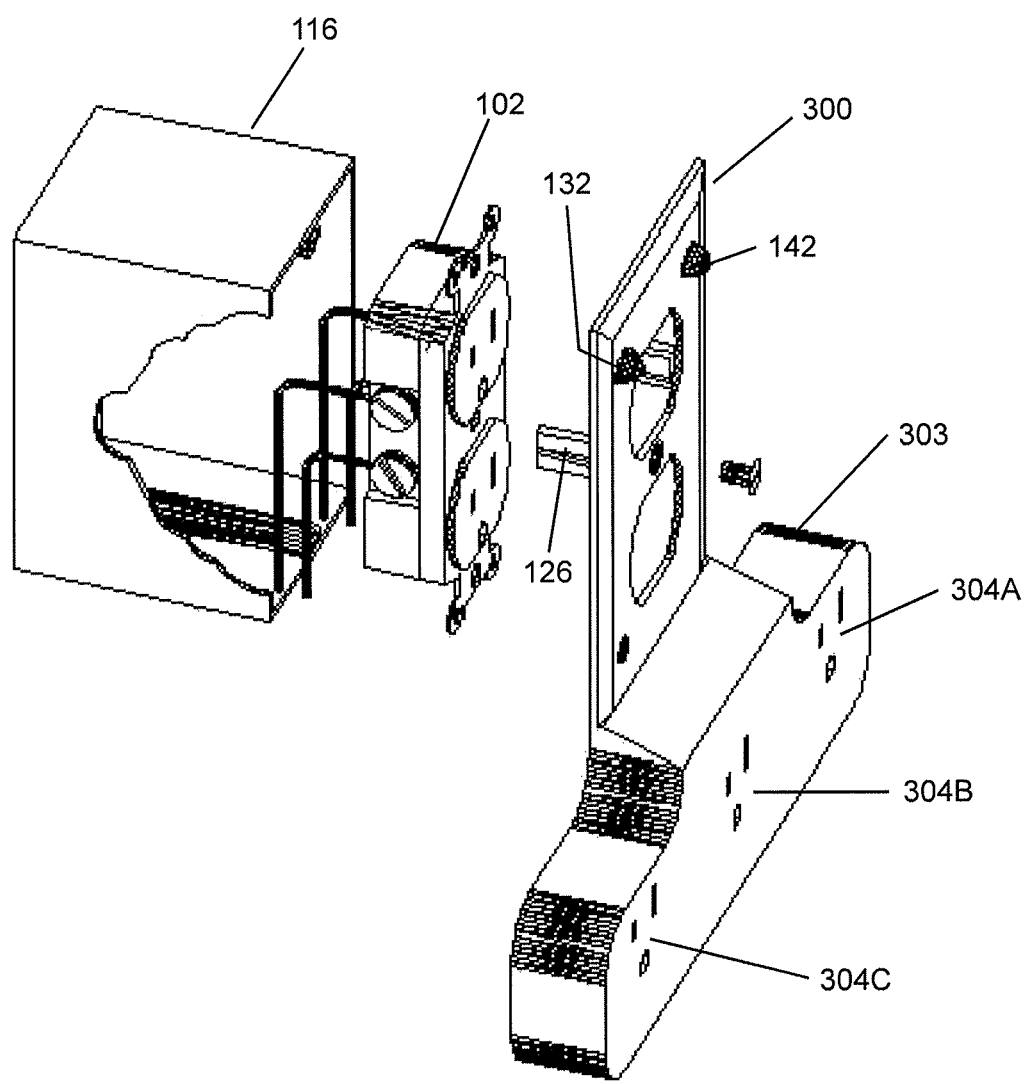
FIG. 17 is an exploded view of another embodiment of the cover member configured with plug receiver outlets.

In some examples, the cover may include a port. FIG. 17 illustrates a cover 300 including a port member 303 including three ports 304A, 304B, 304C connected thereto. The port member 303 may be in addition to or instead of the light source(s) 132, 142. The port member 303 or plug adapter may include a single or multiple ports 304A, 304B, 304C to provide power outlets to additional devices. In one example, the ports 304A, 304B, 304C may function similar to a power strip, but may not require a connection to the female connector 104A, 104B of the electric receptacle 102. As will be appreciated by those skilled in the art, the port member 303 may be formed as a separate component that is operably coupled to the cover 300, or may alternatively be formed integral with the cover 300.

Power may be supplied from the hot and neutral power 106, 108 lines via contact with the power transmission tabs 126, 128. Thus, in this example, the cover 300 may transfer a portion of the AC power through the power transmission tabs 126, 128 rather than converting all of the AC power to a reduced DC voltage. The ports 304A, 304B, 304C may then have AC power provided directly thereto. Stated alternatively, the port member 303 may receive 110/120 volts AC from the hot and neutral lines 106, 108 by way of the power transmission tabs 126, 128. This may allow the ports 304A, 304B, 304C to provide power to an external device in substantially the same manner as the female connectors 104A, 104B of the electric receptacle 102.

Figure 18A:
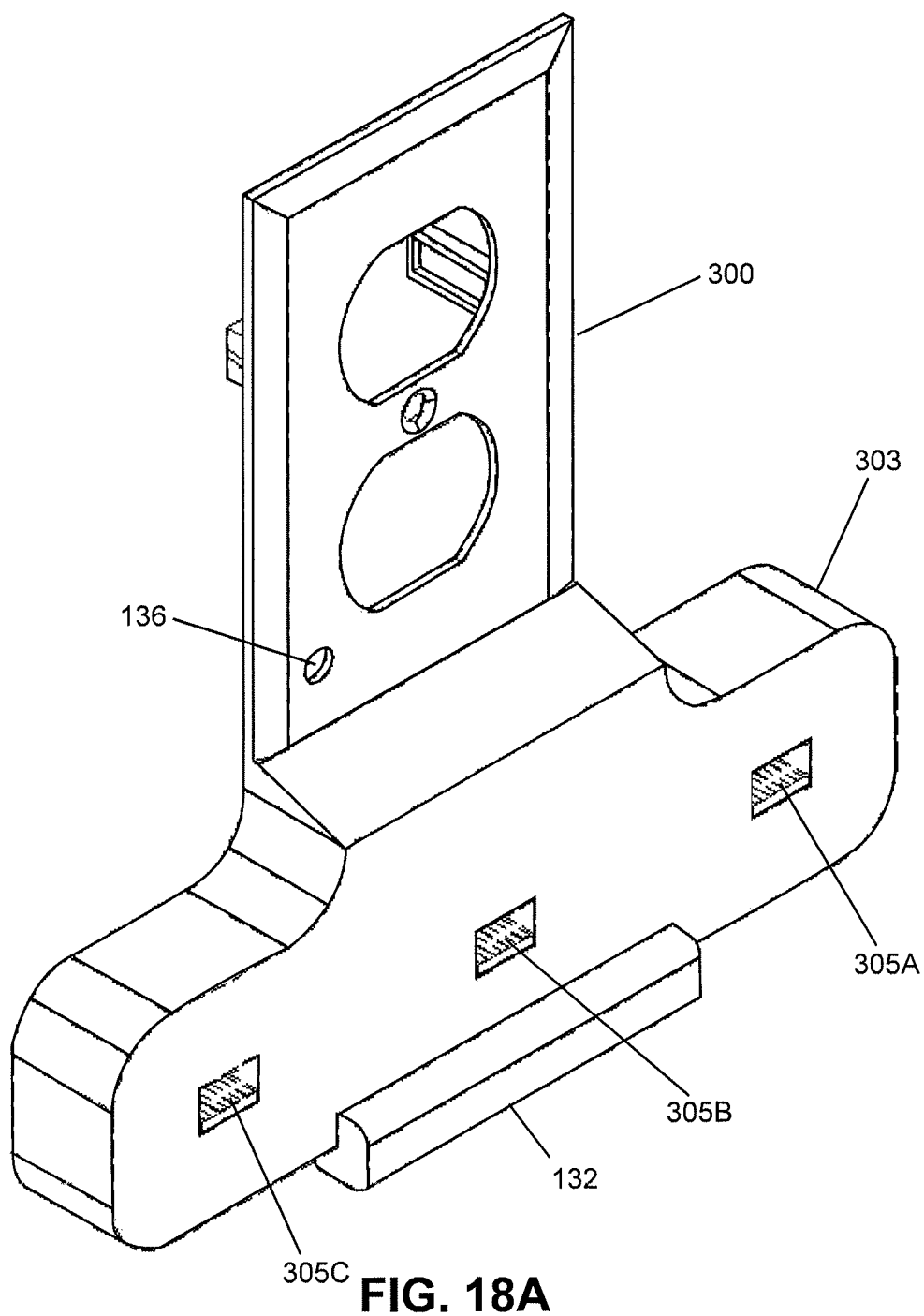
FIG. 18A is a front isometric view of another embodiment of the cover member configured with connector outlets.
Figure 18B:
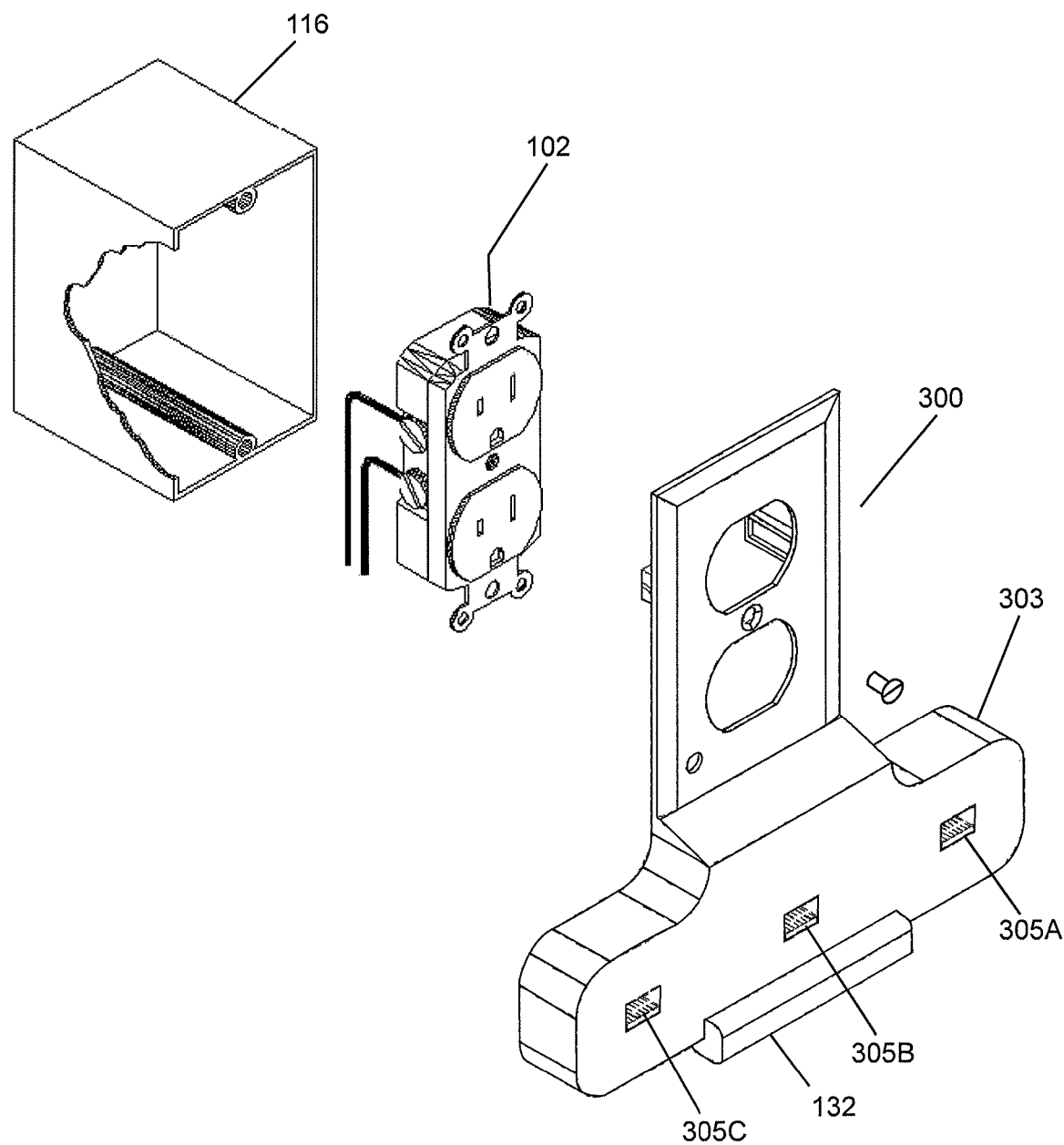
FIG. 18B is an exploded view of the cover of FIG. 18A, the electrical receptacle and the receptacle box.

In some examples, the ports 304A, 304B, 304C may be configured to provide power to connectors other than those configured to be received within the female connectors 104A, 104B of the electric receptacle 102. FIGS. 18A and 18B illustrate the cover member 300 of FIG. 17 including USB ports 305A, 305B, 305C. The port member 300 or plug adapter may provide low voltage DC power from the integrated voltage reduction and conversion circuitry 134 rather than 110/120 volt AC power from the hot and neutral power lines 106, 108. Thus, in addition or alternatively to powering the light source 132, the power may be used (via a connection through the ports 305A, 305B, 305C) for charging various items or devices such as cell phones, computers, portable electronic devices, cameras, and the like. Although illustrated with USB configured ports 305A, 305B, 305C, the cover 300 and port member 300 may include substantially any type of plug/connector. For example, the ports may be configured to provide power to radio frequency cables or to radio frequency devices, such as through radio broadcasting data lines, radio frequency distribution, security system sensing modules for a radio frequency device, or a microcamera.

Figure 19:
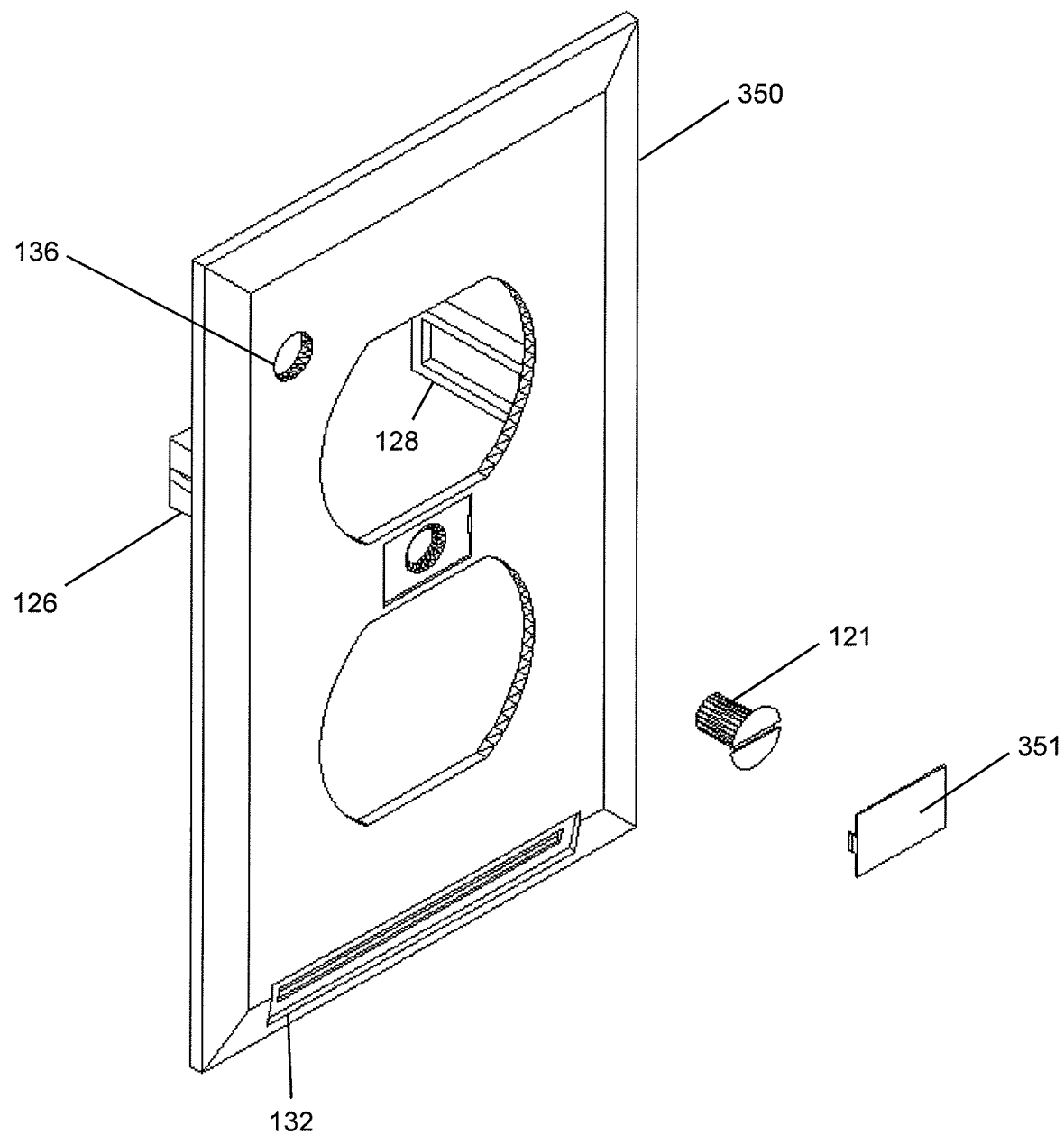
FIG. 19 is a front isometric view of another embodiment of the cover member configured with a safety cover.
Figure 20:
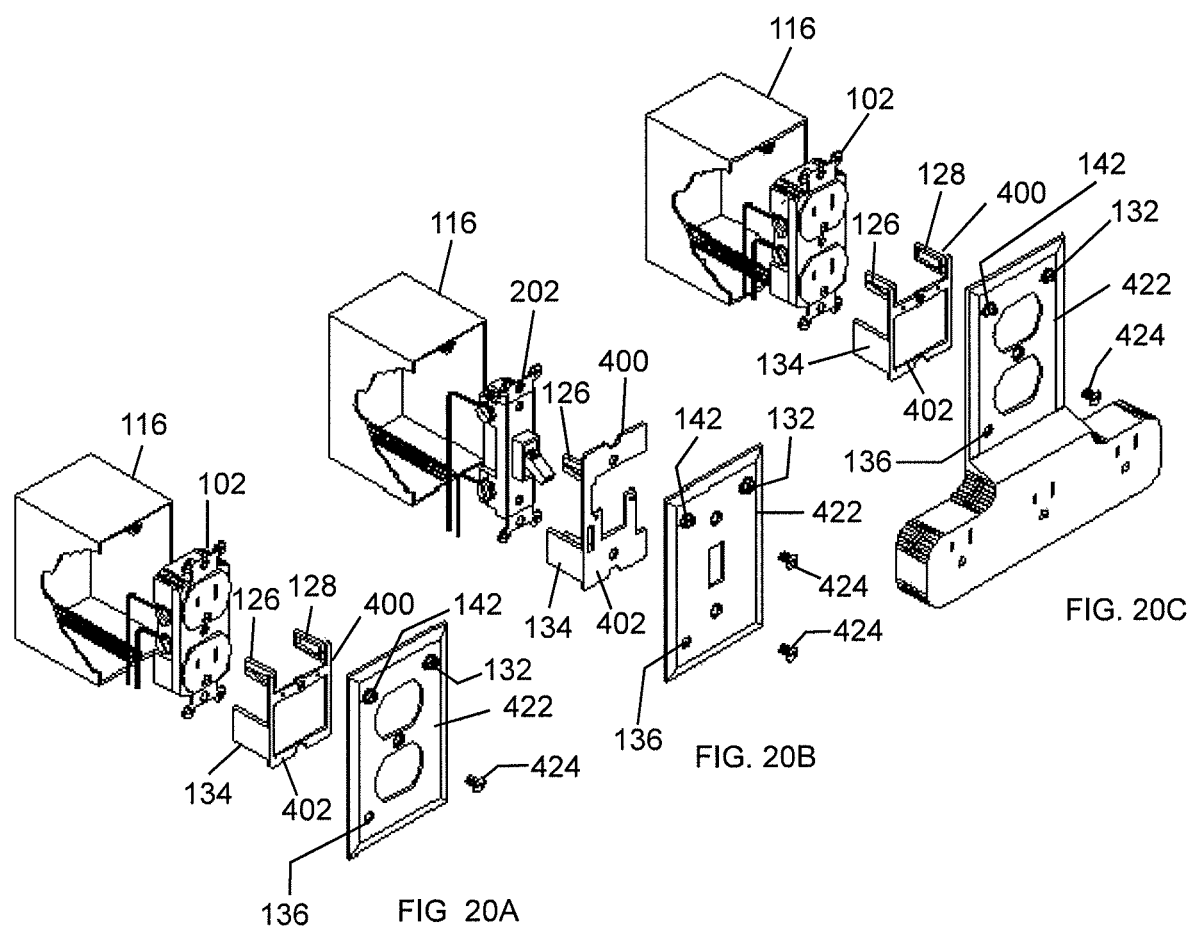
FIG. 20A is an exploded view of a removable power clip module and a first receptacle cover configured to join to the removable power clip module, along with an electrical receptacle and a receptacle box.
FIG. 20B is an exploded view of a removable power clip module and a second receptacle cover configured to join to the removable power clip module, along with an electrical receptacle and a receptacle box.
FIG. 20C is an exploded view of a removable power clip module and a third receptacle cover configured to join to the removable power clip module, along with an electrical receptacle and a receptacle box.
Figure 21:
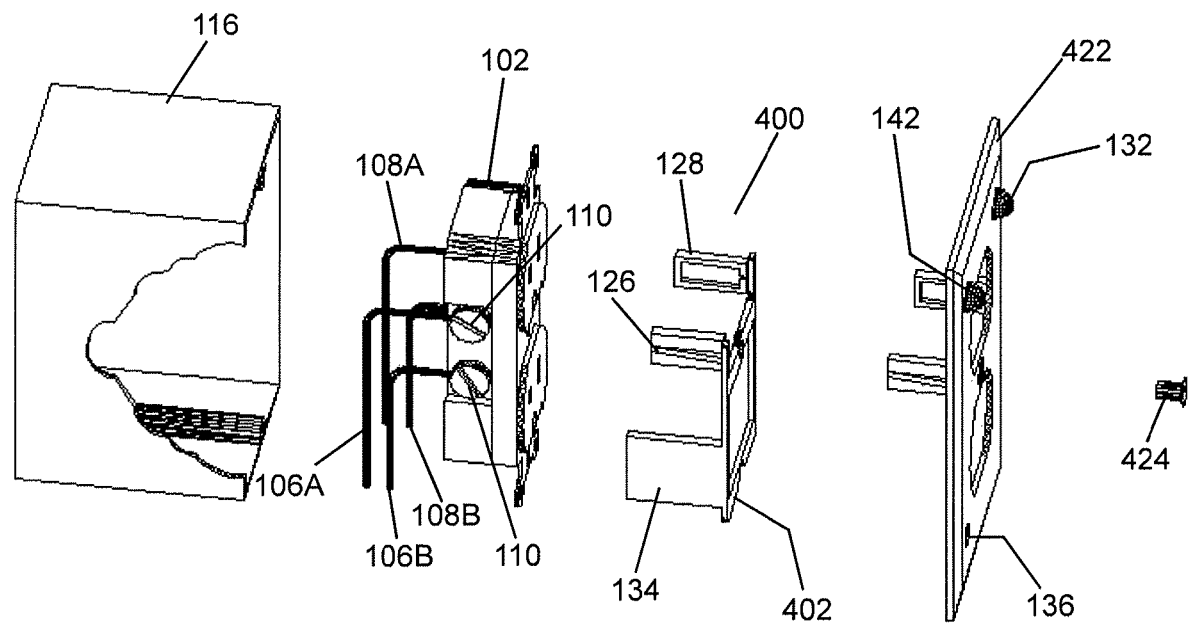
FIG. 21 is another exploded view of the cover member and removable power clip module of FIG. 20A.
Figure 22:
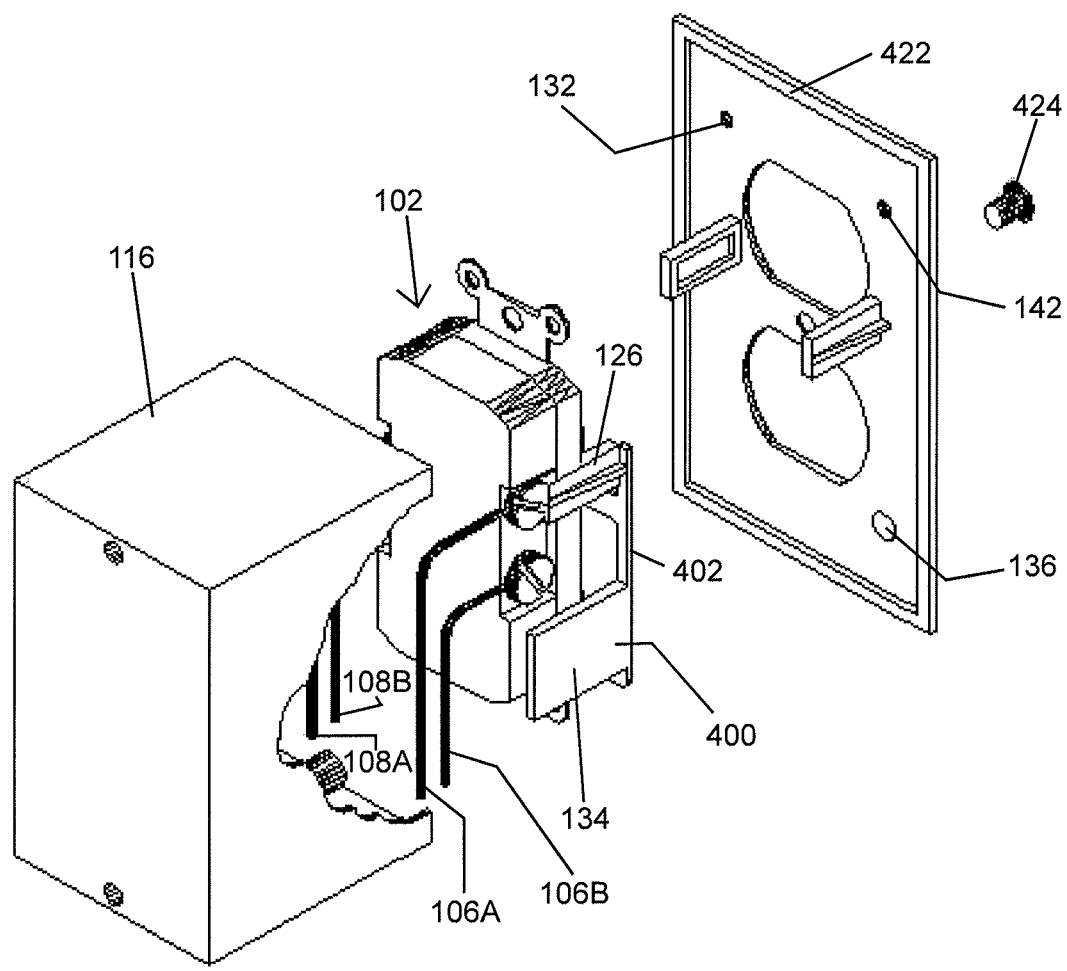
FIG. 22 is a rear exploded view of the cover member and removable power clip module of FIG. 20A.
Figure 23:
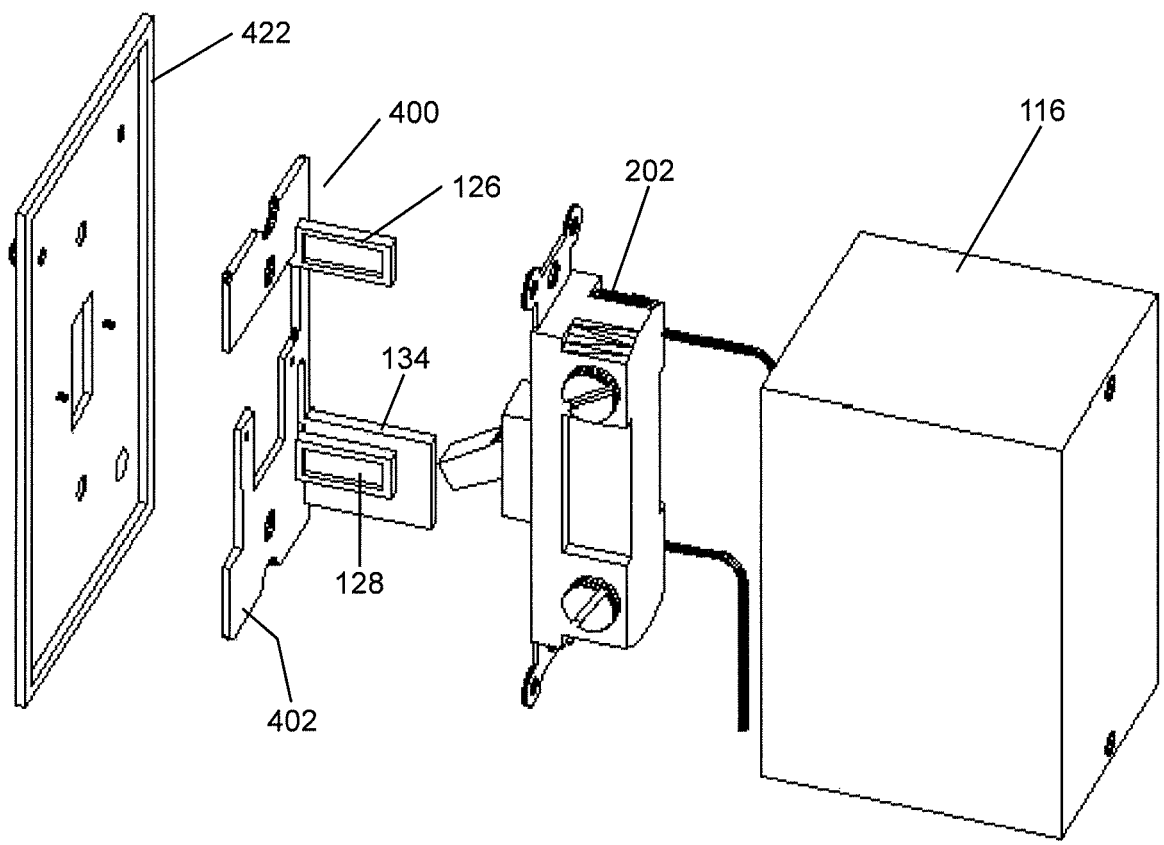
FIG. 23 is another exploded view of the cover member of FIG. 20B.

In some examples, the cover member may include a safety cover for covering a screw that may releasably join the wall plate to the electric receptacle. FIG. 19 illustrates the cover member 350 including a safety cover 351. The safety cover 351 may be configured as a snap-on cover and may be joined to the cover member 350 after the cover member 350 has been joined to the electric receptacle 102 via screw 121. The safety cover 351 may limit access to the screw 121, which may prevent small children from accessing the screw 121 and detaching the cover member 350 from the electric receptacle 102. This example may be useful in cases where the screw 121 is used for grounding the cover member circuitry (e.g., the lower male grounding prong to the female grounding inlet of the outlet cover plug adapter).

The foregoing embodiments were described as having the power transmission tabs and voltage reducing/conversion circuitry coupled to or formed integral with the cover. However, numerous design variations are possible that may perform in a similar manner. In one exemplary alternative design, the power transmission tabs and voltage reducing/conversion circuitry may be provided on a separate power clip module that may be operably connected to both the electric receptacle or light switch module and the corresponding cover having the light source. FIGS. 20A-22 below illustrate several exemplary embodiments of this alternative design.

The various covers 422 in FIGS. 20A-22 may be structured to plug into or other connected to the power clip module 400. The power clip module 400 or transmission insert, may include the requisite circuitry 134 integrated into its framework for converting the 110/120 volts AC to DC power. In these embodiments, the power clip module 400 may include the circuitry 134, power transmission tabs 126, 128 but may be removable from a face plate 422. In this manner the power clip module 400 may be interchanged with different faceplates 422 that may include different openings corresponding to alternative electric receptacles 102, switch receptacles, electronic devices such as lights (e.g., LEDs, electroluminescent panels), sensors, ports, and the like, and may include different colors, textures, or aesthetic deigns.

The power clip module 400 may include a frame 402 configured to be sandwiched between the back of the face plate 422 and the electrical or switch receptacle 102, 202. The frame 402 may define one or more openings, for example, to enable one or more of the female connectors 104A, 104B or the switch 204 to extend through the openings and through the face plate 422. In FIGS. 20A and 20C, the frame opening may be defined by four internal sidewalls and the sidewalls may be sized and shaped to enable the power clip module 400 to join between face plates and receptacles of various configurations. In some implementations, the frame 402 may be a three-sided frame as illustrated in FIG. 20B. The frame of FIG. 20B may be considered to have a C-shape, but it may be appreciated that the frame of FIG. 20B may be configure with a U-shape, and upside down U-shape or a backwards C-shape without departing from the scope of the invention. Other openings may be defined in the frame 402, for example, in order to connect the power clip module 400 to the switch receptacle 102, 202 and the face plate 422 by one or more fasteners 424 or to enable wires or other components to extend through the frame.

The frame of the power clip module 400 may be configured to electrically couple to electrical devices provided in or on the face plate 422. In some implementations, all or a portion of the frame 402 facing the back of the face plate 422 may be constructed of conductive material or may include conductive material in areas facing the electrical connectors 424, 426 provided on the back of the face plate 422 for powering the electrical devices. The electrical connectors 424, 426 may be relatively small contact points that may for example, be rounded or pointed, and may be semi-flexible and may join with opposing conductive surfaces on the clip module 400. In some implementations, the clip module 400 may include the contact points 424, 426 and the face plate 422 may include opposing conductive surfaces. In another example, the frame 402 may be formed from a non-conductive or insulative material and the electrically conductive material may be provided as an insert that is coupled thereto or embedded therein.

The transmission tabs 126, 128 for electrically connecting to the electrical receptacle or switch 102, 202, may extend from the back of the frame 402 in a direction outwardly away and at a right angle from the back of the rear surface of the power clip module 400. The power transmission tabs 126, 128 may be in communication with the conductive portions of the frame and may have an elongated shape, an external profile, one or more conductive surface structures, may be formed of conductive material, and may be resilient or flexible in the same or similar manner to the power transmission tabs 126, 128 described above in connection with FIG. 2. The circuitry 134 may extend from the frame of the power clip module 400 to enable the power clip module 400 to join to the electrical receptacle or switch 102, 202 without interference from the circuitry 134. While the circuitry 134 is shown as extending outwardly and away from a lower portion of the side of the power clip module 400, those skilled in the art will appreciate that the circuitry may be positioned along the top or bottom of the power clip module 400 or may be disposed on the frame 402 (e.g., flexible circuitry may be disposed on or around the frame 402) or may be integrally formed with the frame of the power clip module 400 such that the circuitry 134 does not interfere with the power clip module 400 joining to the electrical receptacle or switch 102, 202.

The faceplate 422 may be operably connected to the electric or switch receptacle 102, 202 by one or more fasteners 424, and the power clip module 400 may be sandwiched between the faceplate 422 and the electric or switch receptacle 102, 202. In some examples, the faceplate 422 may include apertures for the sensor 136 and the light sources 132, 142 and those elements may be included on the power clip module 400. However, in other examples, the faceplate 422 may include the sensor 136, the light sources 132, 142 and the power clip module 400 may be in communication with each element to provide power thereto. In these embodiments, the face plate 422 may electrically connect with the power clip module 400 via corresponding electrical contacts, conductive wiring, or the like, which may be formed on the power clip module 400, on the back of the face plate 422 or both.

In the power clip module 400, the circuitry 134 may be configured to wrap around a portion of a side of the electric receptacle 102. Similar to the transmission tabs 126, 128 the circuitry 134 may "snap-fit" around the electric receptacle 102. However, the circuitry 134 may be configured to be positioned below and insulated from contacting the hot or neutral lines 106, 108 and/or the electrically conductive fasteners 110.

Figure 24:
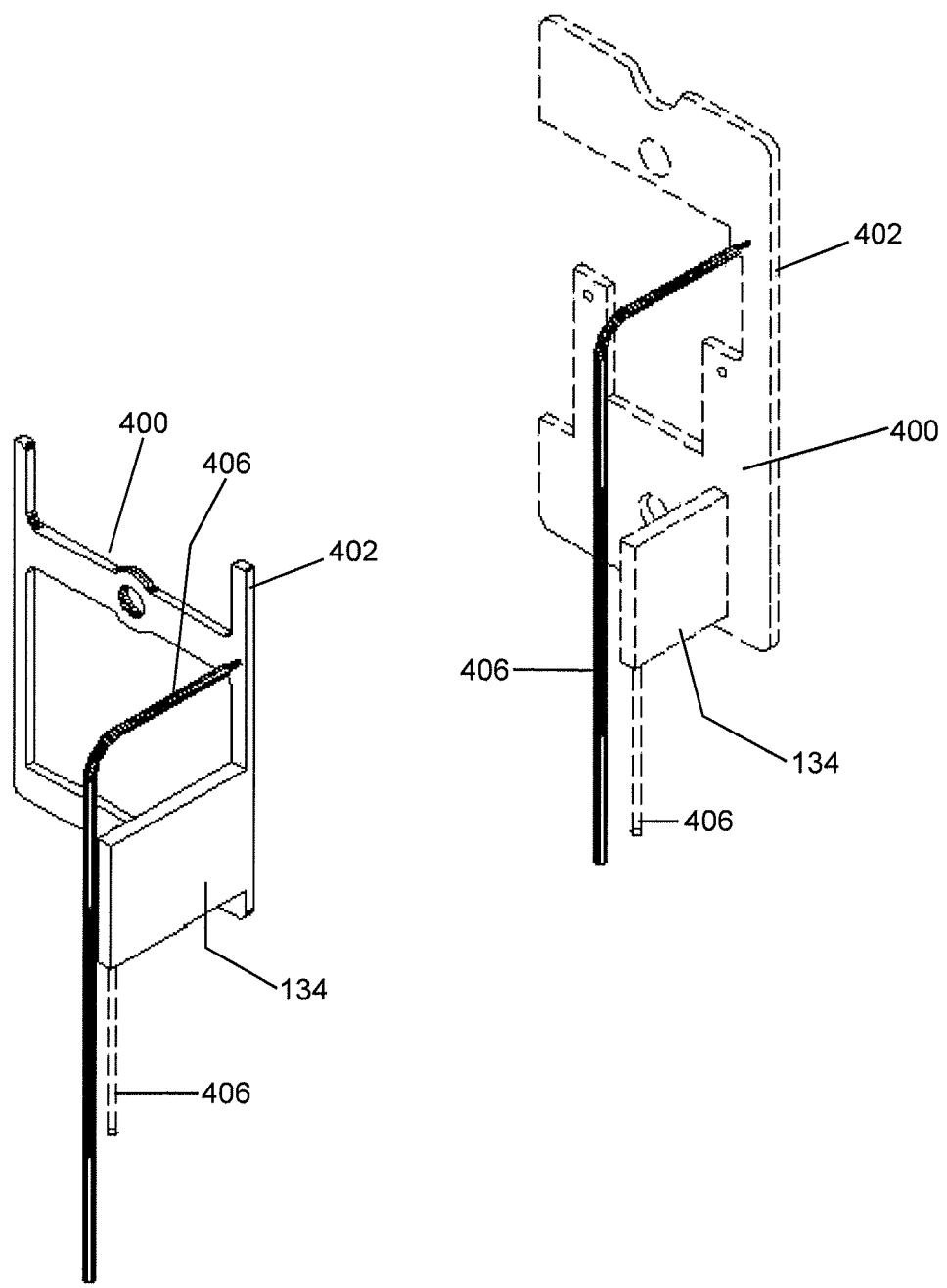
FIG. 24 is a rear perspective view of alternative examples for transferring power to the cover.

As will be appreciated by those skilled in the art, power transmission tabs are only one exemplary way in which the 110/120 volt AC power may be transferred from an electric receptacle or light switch module to the cover of the present invention. FIG. 24 illustrates an alternative means of transferring the AC power from the power clip module 400 to the cover 100. Particularly, the hot and neutral power lines 106, 108 may be hardwired to the power clip module 400 (or alternatively to the cover 100 itself in embodiments that do not utilize the power clip module 400) using electrical leads 406, such as pigtail leads extending from the module 400. The electrical leads 406 may be fixedly coupled to the module 400 (or cover 100), or alternatively may be removably coupled thereto using a suitable connection means (such as a plug-style connector). In other examples, magnetic contacts may also be used to transfer power between the hot and neutral lines 106, 108 and the transmission tabs 126, 128.

The circuitry 134 may be configured to accommodate the different functions of the cover 100. For example, the circuitry 134 may be configured to have a first power reduction amount when the cover 100 may be used in a first country and may have a second power reduction amount in embodiments where the cover 100 may be used in a second country. Similarly, depending on the devices (e.g., light sources 132, 142, sensor 136, ports) included with the cover 100, the circuitry 134 may be configured to provide an adequate power amount and/or processing. Moreover, the circuitry 134 may also include a battery or alternative power source, such that the cover 100 may continued to operate if there is a power loss (e.g., the light source 132 may still be illuminated without power from the hot and neutral lines 106, 108).

Figure 25:
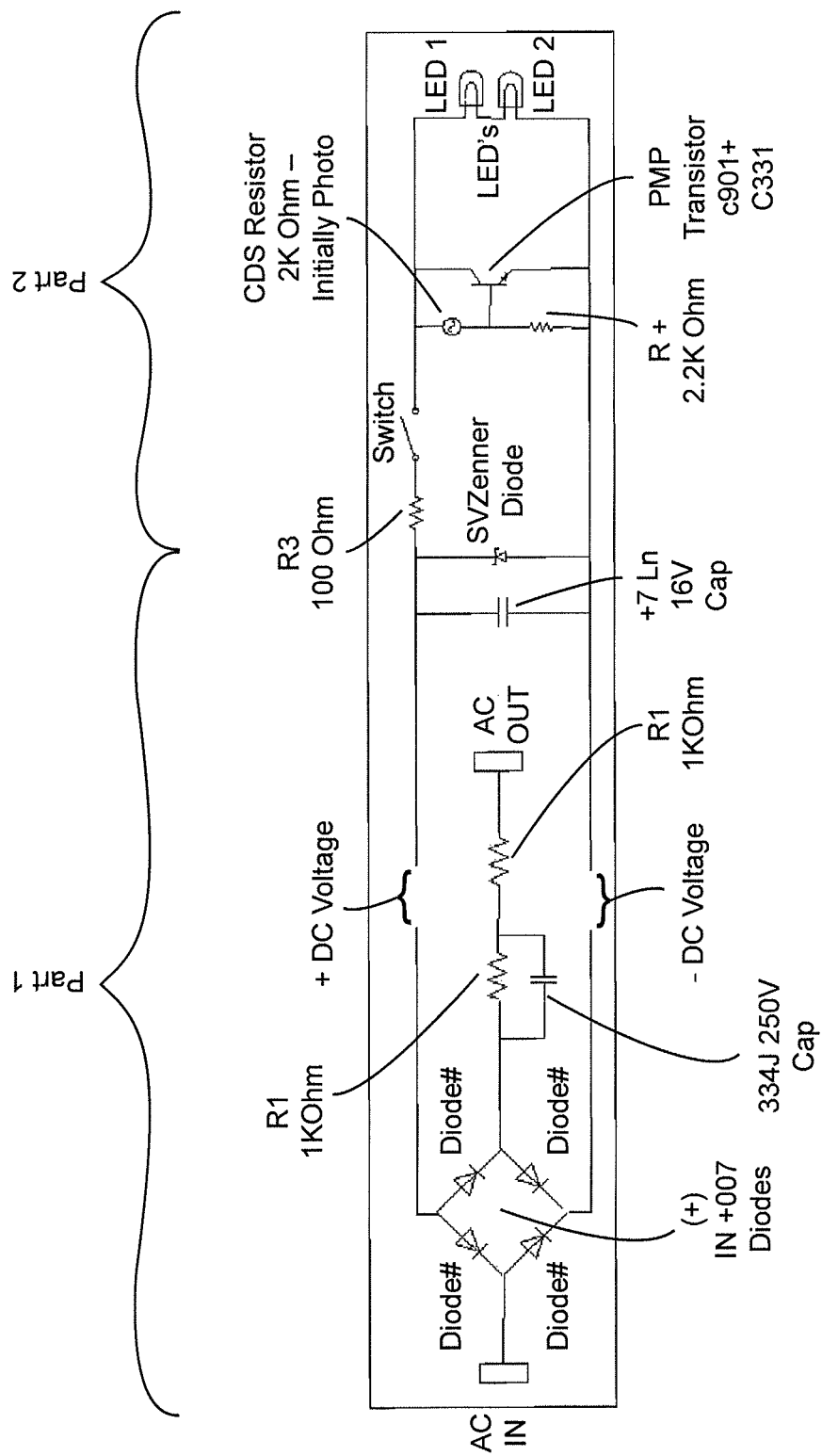
FIG. 25 is an exemplary voltage reduction circuit and conversion that may be incorporated with the cover or the power clip module.
Figure 26:
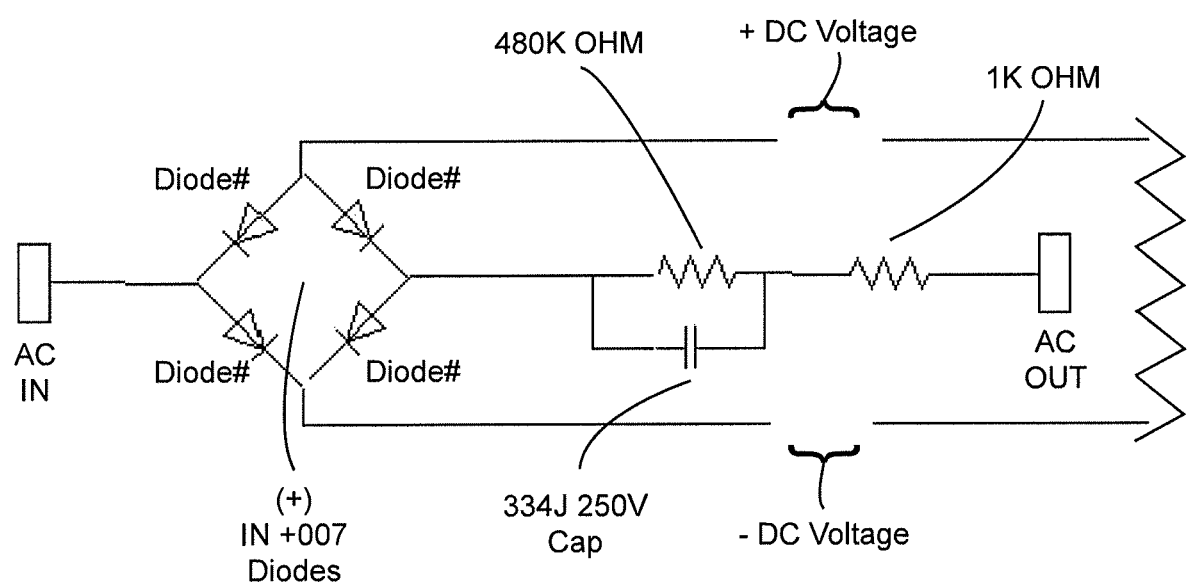
FIG. 26 is an exemplary voltage reduction and conversion circuit that may be incorporated with the cover or the power clip module.
Figure 27:
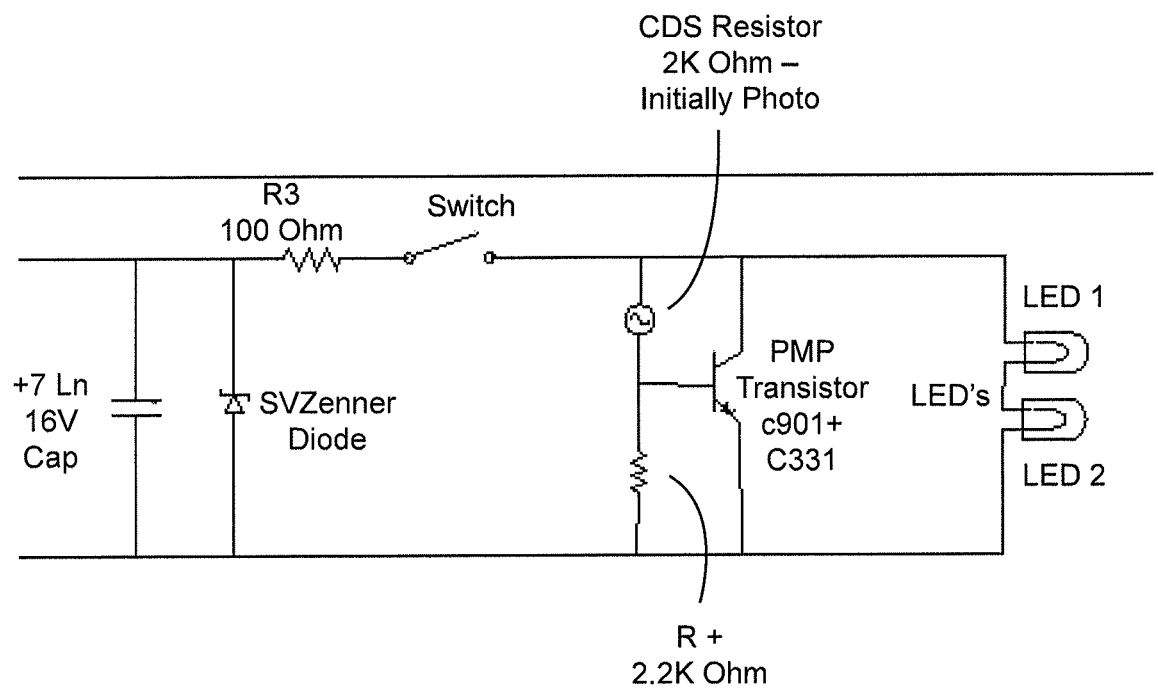
FIG. 27 is an exemplary voltage reduction and conversion circuit that may be incorporated with the cover or the power clip module

In some examples, the circuitry 134 may be a semiconductor active hybrid integrated circuit, or may include electrical components operably connected together on a flexible-circuit board, or the like. FIGS. 25-27 illustrate an exemplary circuit diagram for when the circuitry is configured to provide voltage reduction and conversion functions. However, it should be understood that the following disclosure is presented merely for purposes of example and not limitation, and any suitable circuitry that is operable to reduce voltage and/or convert AC to DC power may be used. Similarly, the values listed for the particular components may be varied depending on the different components and elements selected, e.g., a more powerful light source may require a different type of circuitry and/or component elements.

As illustrated in FIG. 25, the exemplary voltage reduction and power conversion circuitry may be divided into two separate areas or parts and may include the following components: (4) 1N4007 Diodes (to equal a single Rectifier); four Resistors 1K, 460K, 100 and a Photo Sensor CDS 2.2K Ohms; two Capacitors (334J-250V) and 47 uf 16V; one Zener Diode; two LEDs; one PNP Transistor; and on Micro On/Off Switch.

With reference to FIG. 26 below, the circuitry 134 converts the 110/120 volt 60 Hz AC power to DC power using 4 1N4007 diodes creating a bridge rectifier. The circuit filters noise from the AC line with a (334 J-250V) capacitor and a (480 K-Ohm) resistor. Current in the circuit is limited with a (1 K-Ohm) resistor to ground/neutral.

The power transmission tab 126 in contact with the hot AC power line is represented by the "AC In" block in Part 1, while the power transmission tab 128 in contact with the neutral AC power line is represented by the "AC Out" block in Part 1.

With reference to FIG. 27, the (47 uf 16V) capacitor creates a steady DC voltage as power is transmitted from the bridge. The Zener diode clamps the voltage to 5 volts when the transistor turns off and current is forced through the LED load. The Zener diode will operate at about 1.7 volts when the LEDs are turned off or in daytime operation/mode.

As will be appreciated by those skilled in the art, the circuit includes two LEDs merely for purposes of example and not limitation. The number of 100 Ohm resistors is dependent on the number of LEDs and may vary with a change in the number of LEDs and/or elements used as the light sources 132, 142.

The CDS resistor creates a 2 K-Ohm resistive value during daytime mode and slows current to flow through the base of the transistor. This creates a current loop from the collector to emitter which bypasses the LEDs, leaving them off.

In nighttime mode, the CDS Resistor (goes to Infinity and) creates an open to the base of the transistor. Consequently, this turns off the current flow through the transistor, which turns on current flow through the LEDs.

As will be appreciated by those skilled in the art based upon the foregoing diagrams, the circuit is operable to turn on the LEDs at dusk and turn them off at dawn. Thus, the circuit is designed for safety and provides light to be delivered to the faceplate of the receptacle/switch cover automatically when it is dark (to provide a "nightlight" environment). The on/off switch provides for the manual operation of the light source when it is desirable to override the automatic operation.

Figure 28:
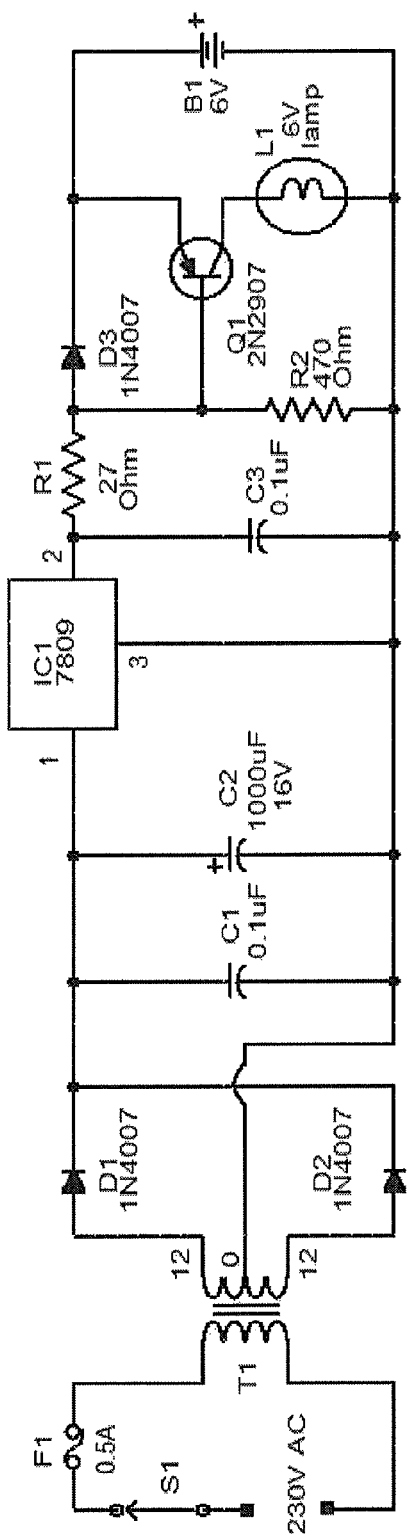
FIG. 28 is an exemplary light source circuit that may be incorporated with the cover or the power clip module to provide a light during a loss in power.

In addition to being used as a "nightlight," the LED light source may also be used as an automatic "emergency light" that turns on when there is a power failure. Thus, in addition to incorporating circuitry for reducing/converting voltage to power the light source, the present invention may further incorporate circuitry that provides for use of the light source during a loss in main power. One exemplary circuit that may be used for such a purpose is set forth in FIG. 28 below. However, any suitable circuit may be used without departing from the intended scope of the present invention.

Figure 29:
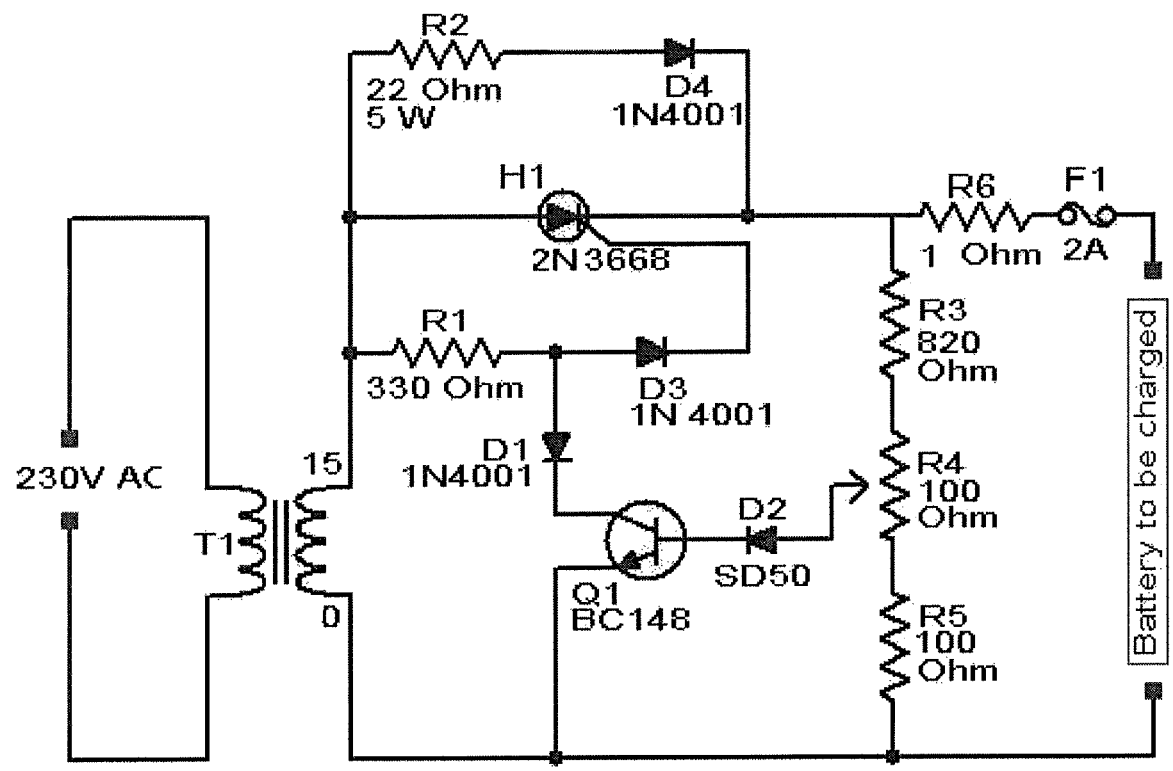
FIG. 29 is an exemplary backup power circuit that may be incorporated with the over or the power clip module to recharge a battery.

It may be desirable to provide a backup source of power for the nightlight in the form of a battery. It may further be desirable to provide circuitry for automatically recharging the battery to avoid having to periodically check battery life and replace the battery. One exemplary circuit that may be used for such a purpose is set forth in FIG. 29. However, any suitable circuit may be used without departing from the intended scope of the present invention.

One other possible circuit design not shown, is a low-voltage DC micro-timing circuit which could be incorporated into the lighting circuitry that would allow one to set on and off timing points instead of the use of or combined with sensor 136, e.g., photo/proximity sensors. This may allow a user to set the time of day or night one would want to engage the low-voltage LED lighting to go on or off or off and on as to accommodate varied lifestyles.

Although the present invention has been described with reference to preferred embodiments, workers skilled in the art will recognize that changes may be made in form and detail without departing from the spirit and scope of the invention.

The invention claimed is:

1. A cover for an electrical receptacle or switch, the cover comprising:
a faceplate; and
at least one transmission tab configured to be electrically connected to a power line of the electrical receptacle;
wherein the transmission tab is configured as an elongated, rigid, or semi-flexible tab extending from a back side of the faceplate and including one or more conductive surface structures configured to face a conductive portion of the electrical receptacle or switch.

2. The cover of claim 1, further comprising a safety cover coupled to the faceplate, wherein the safety cover is positioned over a screw attached to the faceplate.

3. The cover of claim 2, wherein the safety cover is configured to snap onto the faceplate after the screw is attached to the faceplate.

4. The cover of claim 1, wherein the faceplate is coupled to the electrical receptacle or switch via an adhesive.

5. The cover of claim 1, wherein the faceplate further comprises an on/off switch.

6. The cover of claim 5, wherein the cover further includes a circuital driven device in communication with the transmission tab.

7. The cover of claim 6, wherein the cover further includes a sensor in communication with the device, the sensor configured to activate the device in response to detected motion or light.

8. The cover of claim 7, wherein the on/off switch is configured to override the sensor.

9. The cover of claim 6, wherein the circuital driven device includes a light source.

10. The cover of claim 9, wherein the light source is a light bar or a light diffuser.

11. The cover of claim 9, wherein the light source is configured to be exposed around one or more sides of the faceplate such that the faceplate is backlit.

12. The cover of claim 1, wherein the faceplate is formed of a self-illuminating plastic material, a plastic material configured to illuminate upon application of a voltage, an LED plastic sheet, a translucent/electroluminescent material, or is coated with an illuminating material.

13. The cover of claim 1, further comprising a port member coupled with the faceplate, the port member including at least one port configured to provide power to an appliance.

14. The cover of claim 13, wherein the port member is configured to provide power to radio frequency cables and/or to radio frequency devices, such devices comprising radio broadcasting data lines, radio frequency distribution, security system sensing modules for a radio frequency device, or a microcamera.

15. The cover of claim 1, further comprising a circuitry in communication with the transmission tab.

16. The cover of claim 15, wherein the circuitry comprises a semiconductor active hybrid integrated circuit or electrical components operably connected on a flexible-circuit board, the circuitry configured to covert an AC voltage to a DC voltage and provide power to one or more appliances, the one or more appliances integral to the cover or wherein the cover comprises the one or more appliances.

17. The cover of claim 15, wherein the circuitry includes a battery, the battery configured to provide a backup power source for an appliance communicatively coupled with the at least one transmission tab.

18. A cover for an electrical receptacle or switch, the cover comprising:
a faceplate, the faceplate comprising a flush-mounted device configured to snap onto the electrical receptacle or switch;
at least one transmission tab configured to be electrically connected to a power line of the electrical receptacle; and
an electrically driven appliance in communication with the at least one transmission tab,
wherein the transmission tab is configured as an elongated, rigid, or semi-flexible tab extending from a back side of the faceplate and including one or more conductive surface structures configured to face a conductive portion of the electrical receptacle or switch.

19. The cover of claim 18, further comprising a photodetector or a photosensor in communication with the transmission tab.

20. The cover of claim 18, further comprising a clip module coupled to the faceplate, the clip module comprising an integrated voltage reduction and conversion circuitry.

\* \* \* \* \*